United States Patent
Mooney et al.

(10) Patent No.: US 10,802,941 B2
(45) Date of Patent: Oct. 13, 2020

(54) PROCESSING TOOL MONITORING

(71) Applicant: Edwards Limited, Burgess Hill (GB)

(72) Inventors: Michael Mooney, Brighton (GB); Vincent Giorgi, Eastbourne (GB)

(73) Assignee: Edwards Limited, Burgess Hill (GB)

(*) Notice: Subject to any disclaimer, the term of this patent is extended or adjusted under 35 U.S.C. 154(b) by 329 days.

(21) Appl. No.: 15/549,927

(22) PCT Filed: Jan. 13, 2016

(86) PCT No.: PCT/GB2016/050080
§ 371 (c)(1),
(2) Date: Aug. 9, 2017

(87) PCT Pub. No.: WO2016/128709
PCT Pub. Date: Aug. 18, 2016

(65) Prior Publication Data
US 2018/0032419 A1 Feb. 1, 2018

(30) Foreign Application Priority Data
Feb. 12, 2015 (GB) .................. 1502312.0

(51) Int. Cl.
G06F 11/34 (2006.01)
G05B 23/02 (2006.01)
(Continued)

(52) U.S. Cl.
CPC ...... *G06F 11/3409* (2013.01); *G05B 23/0229* (2013.01); *G05B 23/0245* (2013.01);
(Continued)

(58) Field of Classification Search
CPC ............ G06F 11/3409; G06F 11/3013; G05B 23/0229; G05B 23/0245;
(Continued)

(56) References Cited

U.S. PATENT DOCUMENTS 5,834,642 A 11/1998 Decain et al.
6,725,351 B1 * 4/2004 Shimizu ................. G11C 16/16
365/185.04
(Continued)

FOREIGN PATENT DOCUMENTS

CN 103968789 A 8/2014
CN 104350440 B 1/2018
(Continued)

OTHER PUBLICATIONS

Combined Search and Examination Report under Sections 17 and 18(3) dated Jun. 30, 2015 in counterpart GB application No. 1502312.0, 8 pps.
(Continued)

*Primary Examiner* — Regis J Betsch
(74) *Attorney, Agent, or Firm* — Shumaker & Sieffert, P.A.

(57) ABSTRACT

A monitoring apparatus may include reception logic operable to receive processing characteristic data generated during the processing of the effluent stream; segregation logic operable to segregate the processing characteristic data into contributing processing characteristic data associated with contributing periods which contribute to a condition of the at least one processing tool and non-contributing processing characteristic data associated with non-contributing periods which fail to contribute to the condition; and fault logic operable to utilise the contributing processing characteristic data and to exclude the non-contributing processing characteristic data when determining a status of the condition.

19 Claims, 21 Drawing Sheets

(51) Int. Cl.
  *G06F 11/30* (2006.01)
  *G01F 1/00* (2006.01)
  *G01K 13/02* (2006.01)
  *G01L 19/00* (2006.01)
  *G01R 21/00* (2006.01)
  *G06Q 10/00* (2012.01)

(52) U.S. Cl.
  CPC ............ *G06F 11/3013* (2013.01); *G01F 1/00* (2013.01); *G01K 13/02* (2013.01); *G01L 19/00* (2013.01); *G01R 21/00* (2013.01); *G05B 2219/31455* (2013.01); *G05B 2219/33296* (2013.01); *G05B 2219/45031* (2013.01); *G06Q 10/20* (2013.01)

(58) Field of Classification Search
  CPC ........... G05B 2219/31455; G05B 2219/33296; G05B 2219/45031; G01F 1/00; G01K 13/02; G01L 19/00; G01R 21/00; G06Q 10/20
  See application file for complete search history.

(56) References Cited

U.S. PATENT DOCUMENTS

| | | | |
|---|---|---|---|
| 6,944,572 | B2 | 9/2005 | Ushiku et al. |
| 6,954,883 | B1* | 10/2005 | Coss, Jr. ............ G05B 19/41875 700/121 |
| 9,593,928 | B2 | 3/2017 | Sprenger |
| 9,740,182 | B2 | 8/2017 | Clark et al. |
| 9,740,185 | B2 | 8/2017 | Nakagawa |
| 10,048,656 | B2 | 8/2018 | Kawaii |
| 2004/0254761 | A1 | 12/2004 | Sakano et al. |
| 2006/0089744 | A1* | 4/2006 | Jalluri ................ G05B 19/4065 700/174 |
| 2006/0259198 | A1 | 11/2006 | Brcka et al. |
| 2008/0010030 | A1 | 1/2008 | Cheung et al. |
| 2008/0294382 | A1* | 11/2008 | Lim .................. H01L 21/67288 702/185 |
| 2010/0243470 | A1 | 9/2010 | Nonomura et al. |
| 2012/0253500 | A1* | 10/2012 | Smith ................ G05B 19/4185 700/121 |
| 2013/0069792 | A1* | 3/2013 | Blevins .................. G05B 17/02 340/815.4 |
| 2014/0052349 | A1 | 2/2014 | Tsukane |

FOREIGN PATENT DOCUMENTS

| | | |
|---|---|---|
| EP | 1650623 A1 | 4/2006 |
| GB | 2246209 A | 5/1991 |
| JP | 2000283056 A | 10/2000 |
| JP | 2002285974 A | 10/2002 |
| TW | 201439694 A | 10/2014 |
| TW | I464552 B | 12/2014 |
| WO | 03102724 A2 | 12/2003 |
| WO | 2012157603 A1 | 7/2014 |

OTHER PUBLICATIONS

International Search Report and Written Opinion dated Apr. 4, 2016 in counterpart International application No. PCT/GB2016/050080, 11 pps.
Office Action and Translation thereof dated May 2, 2019 in counterpart TW Application No. 105103816, 14 pp.
The Notification of Rejection, and translation thereof, from counterpart Japanese Application No. 2017-542399, dated Sep. 17, 2019, 5 pp.
Translation of the Notification of First Office Action from counterpart Chinese Application No. 201680021553.2, dated Feb. 21, 2020, 14 pp.

* cited by examiner

PROCESSING TOOL MONITORING

This application is a national stage entry under 35 U.S.C. § 371 of International Application No. PCT/GB2016/050080, filed Jan. 13, 2016, which claims the benefit of G.B. Application 1502312.0, filed Feb. 12, 2005. The entire contents of International Application No. PCT/GB2016/050080 and G.B. Application 1502312.0 are incorporated herein by reference.

TECHNICAL FIELD

The present disclosure relates to a monitoring apparatus for monitoring at least one processing tool, a method and computer program product.

BACKGROUND

Monitoring processing tools is known. Processing tools, such as those in vacuum pumping and abatement systems, have a vacuum pumping mechanism and a motor for driving the vacuum pumping mechanism, together with abatement and ancillary devices. The vacuum pumping and abatement system may be connected to receive an effluent stream exhausting from a semiconductor processing tool for processing wafers, such as semiconductor wafers; the semiconductor processing tool having, for example, a processing chamber and a transfer chamber.

A condition of these processing tools deteriorates during their operation and a maintenance activity is required to restore, repair or maintain the tools. For instance, a filter may become clogged with particles and require maintenance. Existing techniques seek to schedule these maintenance activities periodically or after the event, but both are inefficient and have significant shortcomings.

Accordingly, it is desired to provide an improved technique for monitoring processing tools.

SUMMARY

According to a first aspect, there is provided a monitoring apparatus for monitoring at least one processing tool during processing of an effluent stream from a semiconductor processing tool, the monitoring apparatus comprising: reception logic operable to receive processing characteristic data generated during the processing of the effluent stream; segregation logic operable to segregate the processing characteristic data into contributing processing characteristic data associated with contributing periods which contribute to a condition of the at least one processing tool and non-contributing processing characteristic data associated with non-contributing periods which fail to contribute to the condition; and fault logic operable to utilise the contributing processing characteristic data and to exclude the non-contributing processing characteristic data when determining a status of the condition.

The first aspect recognizes that a problem with existing techniques is that they rely on a fixed maintenance schedule which is typically dependent on elapsed time since delivery of the system to the customer or since the performance of previous maintenance activity. Such a schedule takes no account of the utilisation and the actual requirements for maintenance activity since a condition of the system may not require maintenance when a maintenance activity is scheduled, or there may be a requirement for a maintenance activity because the system has been used more extensively than envisaged. The first aspect also recognizes that whilst it may be possible to measure the periods during which processing is operational, this can also lead to inaccurate maintenance activities.

Accordingly, a monitoring apparatus provided. The monitoring apparatus may monitor one or more processing tools. The monitoring may be during the processing of an effluent stream of a semiconductor processing tool. The monitoring apparatus may comprise reception logic which may receive processing characteristic data. The processing characteristic data may be generated when the effluent stream is processed. Segregation logic may also be provided. The segregation logic may segregate, separate or classify the processing characteristic data based on whether the characteristic data was generated during a period which contributes to a condition of the tool or was generated during a period which failed to contribute to that condition. Accordingly, the processing characteristic data may be segregated into contributing processing characteristic data and non-contributing processing characteristic data. Fault logic may also be provided. The fault logic may utilize the contributing processing characteristic data when determining a status of the condition. The fault logic may also exclude the non-contributing processing characteristic data when determining that status. In this way, only data generated during periods which contribute to the condition of the tool is used when determining a status of the condition of that tool. Other data generated during periods which do not contribute to that condition are ignored or omitted so that an accurate assessment of the status of the condition of the tool can be determined. This helps to provide an accurate and more reliable assessment of the status of the condition of the tool.

In one embodiment, the receiving comprises receiving the processing characteristic data from the processing tool. Accordingly, the data may be received from the processing tool itself.

In one embodiment, the contributing periods comprise periods first detectable stages and the non-contributing periods comprise second detectable stages. Hence, the contributing periods and non-contributing periods may comprise any detectable or differentiable stages of the operation or non-operation of the processing tool.

In one embodiment, the contributing periods comprise periods when active semiconductor processing occurs and the non-contributing periods comprise periods when no active semiconductor processing occurs. Accordingly, the contributing periods may be those periods when active semiconductor processing occurs, whereas the non-contributing periods may be those when no active semiconductor processing occurs.

In one embodiment, the contributing periods comprise periods when deposition occurs and the non-contributing periods comprise periods when no deposition occurs. Accordingly, for those conditions which occur as a result of deposition within the semiconductor processing tool, the contributing periods may be those when deposition occurs.

In one embodiment, the contributing periods comprise periods when cleans occur.

In one embodiment, the non-contributing periods comprise periods when purges occur.

In one embodiment, the segregation logic is operable to identify the contributing periods and the non-contributing periods by comparing the processing characteristic data with a threshold amount. Accordingly, should the characteristic data pass through a selected threshold amount then that may identify the occurrence of contributing or non-contributing periods.

In one embodiment, the segregation logic is operable to identify the contributing periods and the non-contributing periods by detecting an amount of deviation in the processing characteristic data.

In one embodiment, the segregation logic is operable to identify the contributing periods and the non-contributing periods by pattern matching in the processing characteristic data. In one embodiment, the segregation logic is operable to identify the contributing periods and the non-contributing periods by pattern matching against known process patterns (typically contained within a process library) in the processing characteristic data. In one embodiment, the segregation logic is operable to identify new patterns (typically to add to the process library) in the processing characteristic data. Hence, particular patterns may be recognised in the processing characteristic data which may be associated with contributing periods and/or non-contributing periods. Examples of machine learning pattern matching algorithms include: C5, K-means, Kohonen maps (clustering algorithms) and neural networks.

In one embodiment, the segregation logic is operable to identify the contributing periods and the non-contributing periods by determining whether the processing characteristic data crosses the threshold amount for a threshold time period. Accordingly, the periods may be identified by the selected threshold amount being crossed for a selected threshold time period.

In one embodiment, the segregation logic is operable to identify the contributing periods and the non-contributing periods by determining at least one of a rising edge time, falling edge time, an area under the processing characteristic data and a difference between values of the processing characteristic data. Accordingly, the periods may be determined in a variety of different ways.

In one embodiment, the segregation logic is operable to identify the contributing periods and the non-contributing periods by Gaussian mixture analysis of the processing characteristic data.

In one embodiment, the fault logic is operable to combine contributing processing characteristic data from the contributing periods to provide combined contributing processing characteristic data. Accordingly, the processing characteristic data from the contributing periods may be combined, aggregated or concatenated together to provide combined contributing processing characteristic data. This provides the cumulative data which affects the status of the condition of the tool.

In one embodiment, the fault logic is operable to combine an average of contributing processing characteristic data from the contributing periods to provide the combined contributing processing characteristic data. Accordingly, rather than combining all of the characteristic data from a period itself, an average or other statistically altered representation of the data may instead be combined; this helps to increase the stability of the data.

In one embodiment, the fault logic is operable to extrapolate the combined contributing processing characteristic data to estimate future contributing processing characteristic data. Accordingly, the combined data may be extrapolated in order to estimate, calculate or approximate the future value of the contributing processing characteristic data. This enables the fault logic to make a prediction of the values of the data which can be used to predict when maintenance may be required.

In one embodiment, the fault logic is operable to extrapolate the combined contributing processing characteristic data to estimate future contributing processing characteristic data using an estimating model.

In one embodiment, the estimating model uses at least one of a linear regression, a polynomial regression, a differential proportional calculation, an integral based calculation, Kalman filtering, particle filtering and case-based reasoning to estimate the future contributing processing characteristic data. The estimating model may use a variety of mathematical modelling techniques which may be combined with experience-based techniques such as, for example, case-based reasoning. To improve accuracy, a corroboration layer may be used which combines the outputs from different techniques to determine the optimal estimate for remaining useful life. Probabilistic reasoning is extensively applied during this stage.

In one embodiment, the estimating model is operable to extrapolate the combined contributing processing characteristic data to estimate future contributing processing characteristic data using at least one of a linear regression, a polynomial regression, a differential proportional calculation, an integral based calculation Kalman filtering, particle filtering and case-based reasoning for a first period and another at least one of the linear regression, the polynomial regression, the differential proportional calculation, the integral based calculation Kalman filtering, particle filtering and case-based reasoning for a second period. Accordingly, a combination of different techniques may be used, each of which may be more appropriate during the first or second periods.

In one embodiment, the estimating model is operable to calibrate recursively using Bayesian estimation techniques and a difference between the future contributing processing characteristic data and subsequently-received processing characteristic data. Accordingly, the predicted future characteristic data may be compared against the actual characteristic data received subsequently estimating model calibrated recursively in order to improve the accuracy of its estimation.

In one embodiment, the fault logic is operable to apply a time-based correction factor to the future contributing processing characteristic data during non-contributing periods. Accordingly, for those conditions whose status alters even when no contributing periods are occurring, a correction may be made to the estimated future data during those periods. For example, the status of some conditions changes during cleans, typically reducing the severity of the status of the condition. By applying a time-based correction, these can be accommodated to make the predictions even more accurate.

In one embodiment, the fault logic is operable to determine a fault condition when the future contributing processing characteristic data crosses a fault threshold. Accordingly, the fault logic determines that the status is a fault when the estimated future characteristic data crosses or exceeds a selected fault threshold.

In one embodiment, the fault logic is operable to provide an indication of a number of contributing periods until the future contributing processing characteristic data crosses the fault threshold. Accordingly, the fault logic may indicate how many contributing periods remain (remaining useful life) until the estimated future contributing characteristic data crosses or exceeds the fault threshold. This enables the fault logic to provide an indication to the operators of how many contributing periods remain until a fault is likely.

In one embodiment, the fault logic is operable to determine a plurality of intensities of fault conditions when the future contributing processing characteristic data crosses a corresponding fault threshold. Accordingly, the fault logic may provide a number of different intensities or severities of fault conditions.

In one embodiment, the fault logic is operable to provide an indication of a number of contributing periods until the future contributing processing characteristic data crosses each of the fault thresholds. Accordingly, the fault logic may indicate to the operator when it is expected that each of these different severities of fault conditions may occur.

In one embodiment, each fault threshold is set using a selected deviation from a nominal operating processing characteristic data value. It will be appreciated that a variety of different ways may be used to set each threshold.

In one embodiment, the fault logic is operable to identify a fault condition when the non-contributing processing characteristic data deviates by more than a selected amount during the non-contributing periods. Accordingly, the fault logic may also identify faults when the non-contributing characteristic data deviates or changes by more than a selected threshold amount during the non-contributing periods.

In one embodiment, the processing tool comprises at least one of a vacuum pump and an abatement apparatus.

In one embodiment, the processing characteristic data comprises at least one of a temperature of one of the processing tool and effluent stream, a pressure of the effluent stream within the processing tool, a power consumption of the processing tool and a flow rate through the processing tool. It will be appreciated that a variety of different measureable characteristic data may be utilised.

According to a second aspect, there is provided a method of monitoring at least one processing tool during processing of an effluent stream from a semiconductor processing tool, the method comprising: receiving processing characteristic data generated during the processing of the effluent stream; segregating the processing characteristic data into contributing processing characteristic data associated with contributing periods which contribute to a condition of the at least one processing tool and non-contributing processing characteristic data associated with non-contributing periods which fail to contribute to the condition; and utilising the contributing processing characteristic data and excluding the non-contributing processing characteristic data when determining a status of the condition.

In one embodiment, the receiving comprises receiving the processing characteristic data from the processing tool.

In one embodiment, the contributing periods comprise periods first detectable stages and the non-contributing periods comprise second detectable stages. Hence, the contributing periods and non-contributing periods may comprise any detectable or differentiable stages of the operation or non-operation of the processing tool.

In one embodiment, the contributing periods comprise periods when active semiconductor processing occurs and the non-contributing periods comprise periods when no active semiconductor processing occurs.

In one embodiment, the contributing periods comprise periods when deposition occurs and the non-contributing periods comprise periods when no deposition occurs.

In one embodiment, the contributing periods comprise periods when cleans occur.

In one embodiment, the non-contributing periods comprise periods when purges occur.

In one embodiment, the segregation comprises identifying the contributing periods and the non-contributing periods by comparing the processing characteristic data with a threshold amount.

In one embodiment, the segregation comprises identifying the contributing periods and the non-contributing periods by detecting an amount of deviation in the processing characteristic data.

In one embodiment, the segregation comprises identifying the contributing periods and the non-contributing periods by pattern matching in the processing characteristic data.

In one embodiment, the segregation comprises identifying the contributing periods and the non-contributing periods by determining whether the processing characteristic data crosses the threshold amount for a threshold time period.

In one embodiment, the segregation comprises identifying the contributing periods and the non-contributing periods by determining at least one of a rising edge time, falling edge time, an area under the processing characteristic data and a difference between values of the processing characteristic data.

In one embodiment, the segregation comprises identifying the contributing periods and the non-contributing periods by Gaussian mixture analysis of the processing characteristic data.

In one embodiment, the utilising comprises combining contributing processing characteristic data from the contributing periods to provide combined contributing processing characteristic data.

In one embodiment, the utilising comprises combining an average of contributing processing characteristic data from the contributing periods to provide the combined contributing processing characteristic data.

In one embodiment, the utilising comprises extrapolating the combined contributing processing characteristic data to estimate future contributing processing characteristic data.

In one embodiment, the utilising comprises extrapolating the combined contributing processing characteristic data to estimate future contributing processing characteristic data using an estimating model.

In one embodiment, the using the estimating model comprises using at least one of a linear regression, a polynomial regression, a differential proportional calculation, an integral based calculation Kalman filtering, particle filtering and case-based reasoning to estimate the future contributing processing characteristic data.

In one embodiment, the using the estimating model comprises extrapolating the combined contributing processing characteristic data to estimate future contributing processing characteristic data using at least one of a linear regression, a polynomial regression, a differential proportional calculation, an integral based calculation Kalman filtering, particle filtering and case-based reasoning for a first period and another at least one of the linear regression, the polynomial regression, the differential proportional calculation, the integral based calculation Kalman filtering, particle filtering and case-based reasoning for a second period.

In one embodiment, the method comprises calibrating the estimating model recursively using Bayesian estimation techniques and a difference between the future contributing processing characteristic data and subsequently-received processing characteristic data.

In one embodiment, the utilising comprises applying a time-based correction factor to the future contributing processing characteristic data during non-contributing periods.

In one embodiment, the utilising comprises determining a fault condition when the future contributing processing characteristic data crosses a fault threshold.

In one embodiment, the utilising comprises providing an indication of a number of contributing periods until the future contributing processing characteristic data crosses the fault threshold.

In one embodiment, the utilising comprises determining a plurality of intensities of fault conditions when the future contributing processing characteristic data crosses a corresponding fault threshold.

In one embodiment, the utilising comprises providing an indication of a number of contributing periods until the future contributing processing characteristic data crosses each of the fault thresholds.

In one embodiment, the method comprises setting each fault threshold using a selected deviation from a nominal operating processing characteristic data value.

In one embodiment, the utilising comprises identifying a fault condition when the non-contributing processing characteristic data deviates by more than a selected amount during the non-contributing periods.

In one embodiment, the processing tool comprises at least one of a vacuum pump and an abatement apparatus.

In one embodiment, the processing characteristic data comprises at least one of a temperature of one of the processing tool and effluent stream, a pressure of the effluent stream within the processing tool, a power consumption of the processing tool and a flow rate through the processing tool.

According to a third aspect, there is provided a computer program product operable, when executed on a computer, to perform the method steps of the second aspect.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

BRIEF DESCRIPTION OF THE DRAWINGS

Embodiments of the present disclosure will now be described further, with reference to the accompanying drawings.

DETAILED DESCRIPTION

Figure 1:
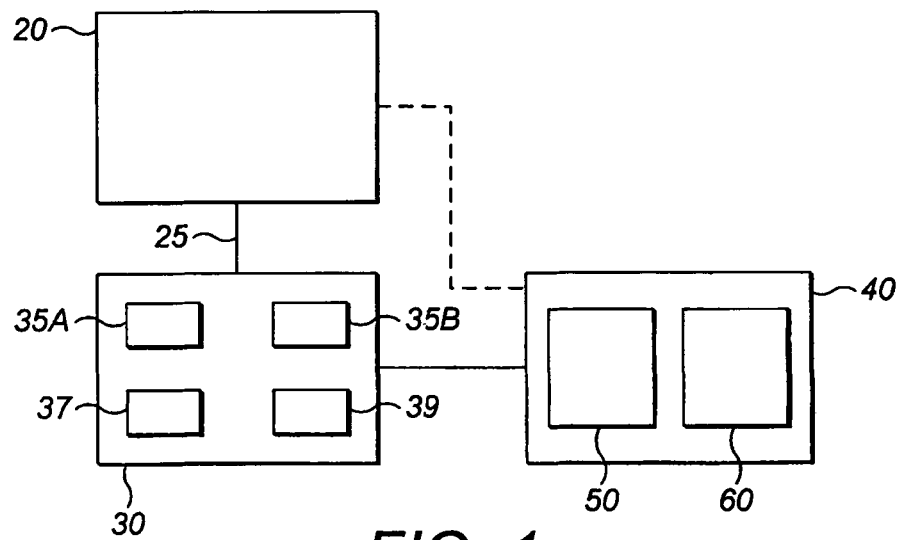
FIG. 1 illustrates a semiconductor processing apparatus according to one embodiment.

Before discussing the embodiments in any more detail, first an overview will be provided. Embodiments provide a technique which monitors the condition, state or status of one or more processing tools which process an effluent stream. Typically, the effluent stream is provided from a semiconductor processing tool during processing by said semiconductor processing tool.

Data is received from the processing tools while the effluent stream is being processed (data may also be received whilst no effluent stream is being received). The data provides processing characteristics measured by or experienced by the processing tool such as characteristics or properties of the effluent stream or operating characteristics or properties of the processing tool itself.

This data is then segregated or classified into one of two different classification groups. The first identifies that data (contributing data) which contributes to a particular condition of the processing tool. The second is that data (non-contributing data) which makes no contribution to the particular condition of the processing tool. In this way, of all the characteristic data that is received, only that proportion of the characteristic data which relates to some processing being performed by the processing tool and which affects the condition or status of the processing tool is used when determining the status of that condition, the remaining data is excluded since it has been determined that that data makes no contribution to that condition. By excluding the non-contributing data, an accurate assessment of the condition can be made.

It will be appreciated that a variety of different techniques may be utilized to identify those contributing and non-contributing periods. These may be signalled by the semiconductor processing tool itself or may be inferred from the characteristics measured by the processing tools or from characteristics of the processing tools themselves during processing.

Typically, the contributing periods will be those periods when active processing of the semiconductors, such as periods of deposition. Such periods will typically have an adverse impact on the processing tools, typically leading to some failure. By determining the status of the condition of the tools, it is possible to predict the likelihood of failure and estimate how many processing steps or cycles can be performed until it is likely that a failure will occur. This enables preventive maintenance to be planned and performed, and reduces the likelihood of failure occurring during processing which could otherwise lead to possible damage to partially processed semiconductors and lead to wastage. Further, it is important to note that through segmentation of the various stages over the process cycle, it is possible to determine when there is a significant change in parameters during any given stage. This can lead to improved fingerprinting of monitoring equipment during normal conditions and thus the ability to track important changes and deviations in working conditions.

Semiconductor Processing Apparatus

FIG. 1 illustrates a semiconductor processing apparatus, generally 10 according to one embodiment. A semiconductor processing tool 20 is provided within which semiconductor processing occurs. Such semiconductor processing may comprise the growth of semiconductors, the growth of semiconductor layers, the implantation of semiconductor layers and/or the creation of other structures in conjunction with semiconductor materials. An abatement apparatus 30 is provided which is coupled with the semiconductor processing tool 20 and receives an effluent stream via a conduit 25. The abatement apparatus 30 operates to remove or change the composition of hazardous materials or reduce the concentration of those materials to acceptable levels prior to the treated effluent stream venting to atmosphere. The abatement apparatus 30 will typically include one or more vacuum pumps 35A, 35B, together with a burner, plasma torch or similar device 37 and one or more scrubbing devices 39, as is well-known in this field. It will be appreciated that the vacuum pumps 35A, 35B may be arranged in parallel and feed into the device 37.

A monitoring apparatus 40 is provided which is coupled with the abatement apparatus 30 to receive data from components of the abatement apparatus. Should the semiconductor processing tool 20 also provide data then this is also received by the monitoring apparatus 40.

The components of the abatement apparatus themselves can be used as a sensor or sensors may be provided. For example, a vacuum pump can be used to act as a process sensor which provides data which can be analyzed in order to detect and classify the onset of equipment faults occurring within the abatement apparatus 30 and/or upstream or downstream in other equipment. Typically, such faults can be identified through corroboration with other data, as will be explained in more detail below. Using this data it is also possible perform analysis to estimate the remaining useful life of equipment, such as the pump, in terms of the number of process cycles remaining, independently of process tool data.

Such analysis typically utilizes windowing and modelling techniques on the received data in order to robustly detect and classify a range of equipment issues prior to equipment failure. This analysis is done by the monitoring apparatus 40 which comprises data storage 50 for storing the received data as well as the results of data processing performed by analyzing logic 60, typically using one or more models.

The monitoring apparatus 40 then provides an indication of the condition of the abatement apparatus 30 and/or the semiconductor processing tool 20 which can then be used to inform whether a fault has occurred, whether a deviation from normal operation has occurred and/or provide an indication of how many cycles remain until a fault is expected to occur.

Monitoring Operation Overview

Figure 2:
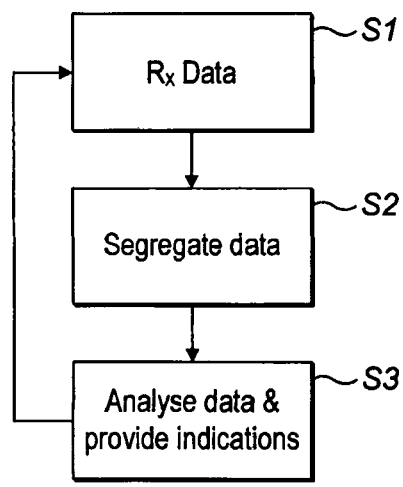
FIG. 2 illustrates the main processing steps performed by the monitoring apparatus shown in FIG. 1.

In the overview, the main processing steps performed by the monitoring apparatus are 40 illustrated in FIG. 2.

At step S1, the monitoring apparatus 40 receives the data from the abatement apparatus 30 and/or the semiconductor processing tool 20. Where more than one set of data is received, typically each relating to a different characteristic, these are typically stored separately.

At step S2, the data is analyzed and then segregated, typically into two different categories. The first category is that data which is deemed not to contribute to the condition of the components of the apparatus and the second category is that data which is deemed to contribute to the condition of the apparatus. For example, the data which contributes to the condition of the apparatus will typically be that which is received during periods of active processing, whereas that data received during periods when no active processing occurs will be non-contributing data. Such segregation in order to identify the different periods and then classify the data within those periods can be performed in a variety of different ways, as will be explained in more detail below.

Once the data has been segregated then, at step S3, the segregated data is then analysed in order to identify whether a fault or deviation (typically from a specified fingerprint condition) has occurred and/or to provide an indication of how long it is likely to be until a fault occurs. As mentioned above, this can then be used for maintenance planning and scheduling.

Monitoring Example

A detailed example of the operation of the monitor apparatus will now described. Although the following example utilizes parameters or characteristics from pumps within the abatement apparatus 30, it will be appreciated that parameters or characteristics from other components could equally be used. Also, although the following example utilizes booster power and exhaust pressure from the pump, it will be appreciated that other parameters relating to the pump itself or to the effluent stream could be provided such as, for example, booster inverter speed, inlet pressure, etc.

Data Collection

To enable, for example, accurate pump process characterization, adequate data sampling is required over the process cycle to capture a variety of gas load conditions. By analysing the distribution of the pump parameters and their sequence over time, it is then possible to characterize process behaviour at key stages of the semiconductor cycle such as, for example, whether a process step or a cleaning step is occurring. In general, a stage consists of pumping a gas for a certain amount of time. Each time a deposition gas load is applied to the pump, the power consumption of the pump increases as well as its exhaust pressure. Each deposition gas flow contains impurities and debris that contribute to exhaust blockage. Accordingly, it is possible to detect and characterize gas loads using the increase in booster power. Cleans tend to follow a deposition high gas load. A lower gas load and associated power consumption occurs during cleaning. It is then possible to differentiate gas loads which are simply "cleans" from those that are "processes". Once each process has been detected in time and characterized, it is possible to know what the exhaust pressure was during the process. In taking the principle further, it is possible to segment other types of faults through segmentation of the semiconductor process. For example, if corrosion occurs during cleans, it is possible to segment the times during cleaning and thus, the times that are contributing to corrosion.

Figure 3:
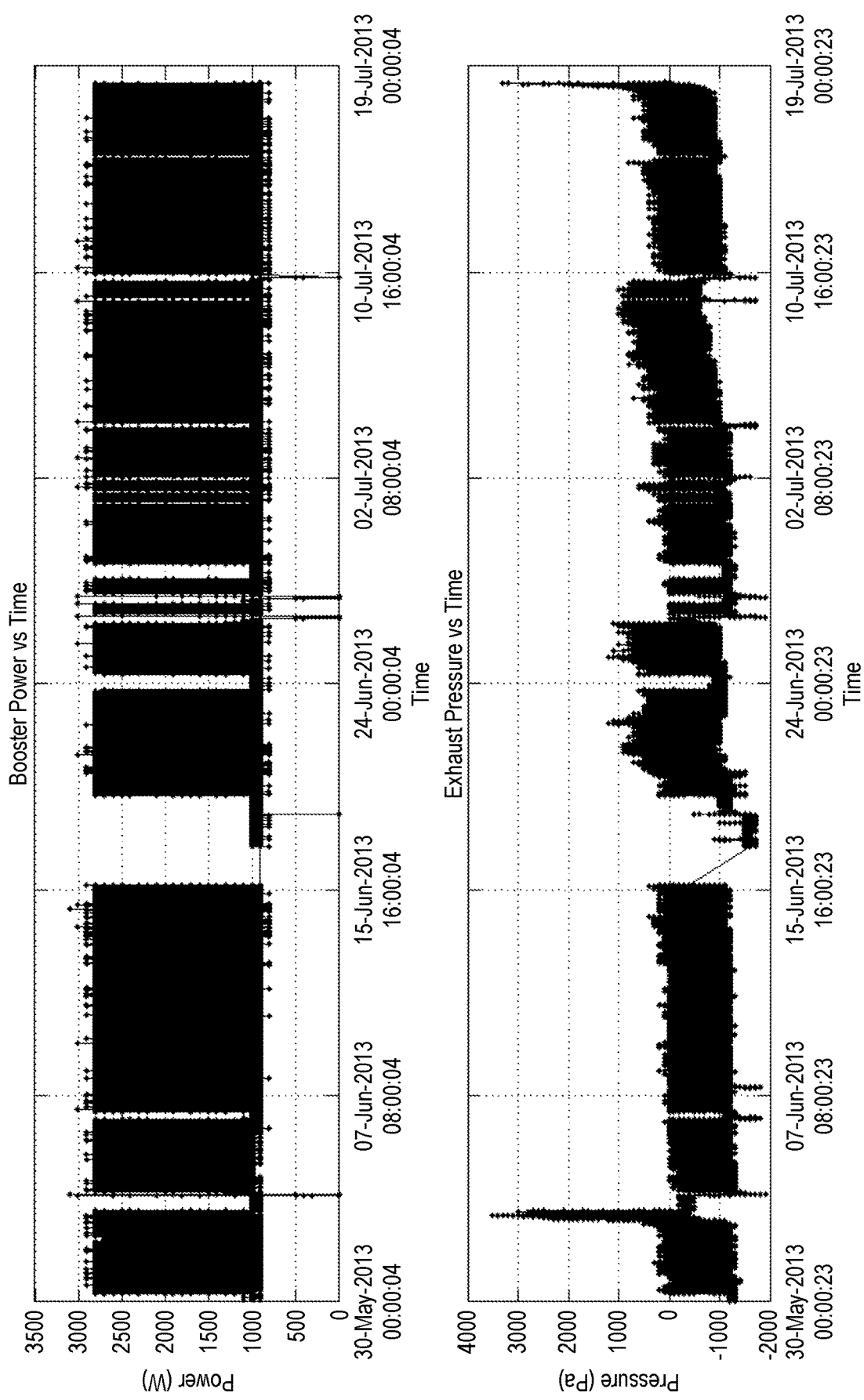
FIG. 3 illustrates example characteristic data received from a pump which includes both the booster power and the exhaust pressure plotted over a period of weeks.
Figure 4:
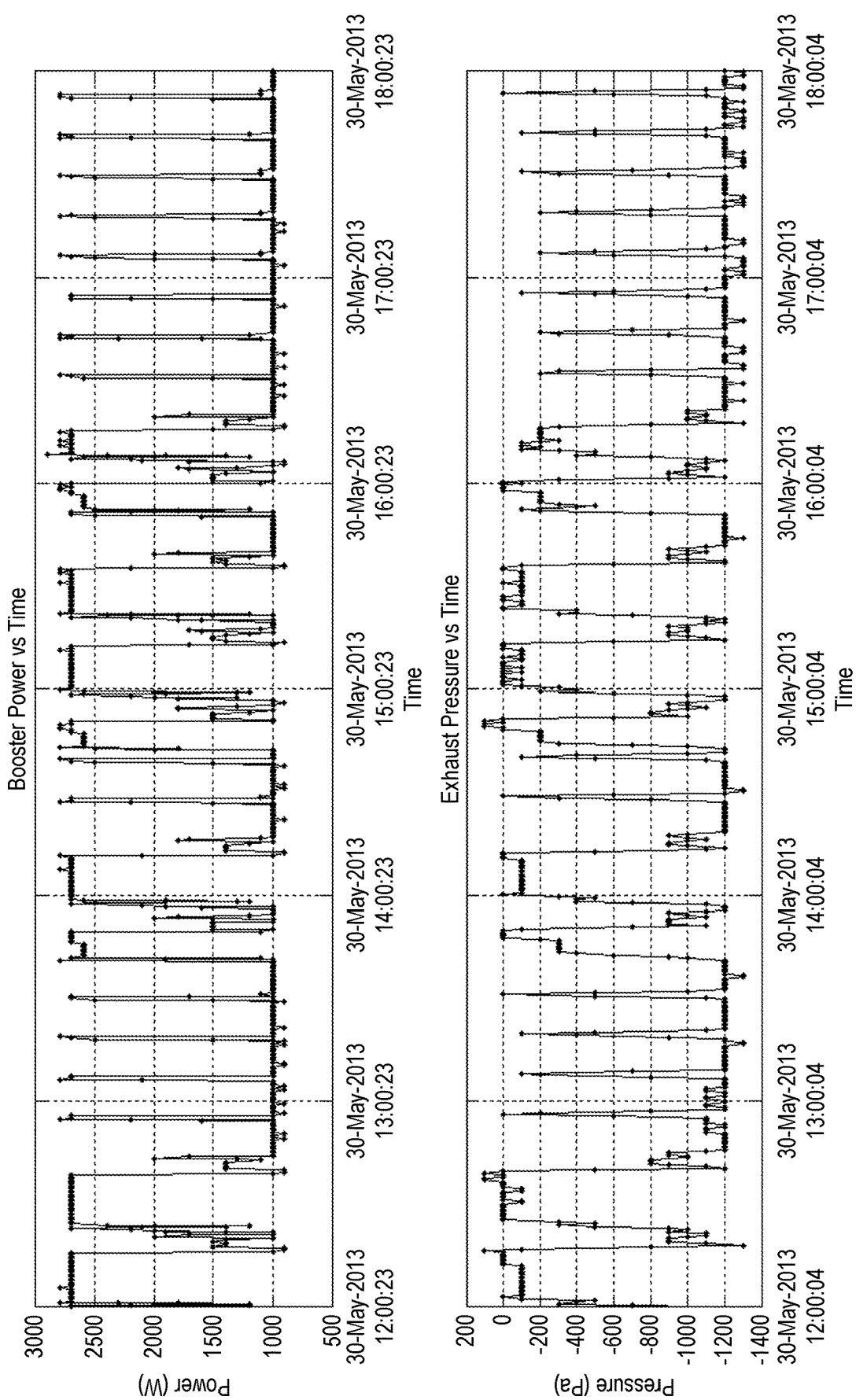
FIG. 4 illustrates a portion of the data of FIG. 3 over a period of a few hours.

FIG. 3 illustrates example characteristic data received from a pump which includes both the booster power and the exhaust pressure plotted over a period of weeks. FIG. 4 illustrates a portion of this data over a period of a few hours.

As can be seen, every gas load causes an increase of power consumption and a synchronized increase of the exhaust pressure, but every peak in power is not associated with a process; some of these peaks are related to purge steps, some are related to cleans. In this example, a peak is detected when the power reaches a given threshold that is chosen depending on the amplitude distribution of the booster power. Since the signal is square, the amplitude distribution has two modes (high and low). The threshold is set at 90% of the higher power amplitude. Each peak is characterized by its width, amplitude, start time, end time and time before next peak.

Data Segregation

Figure 5:
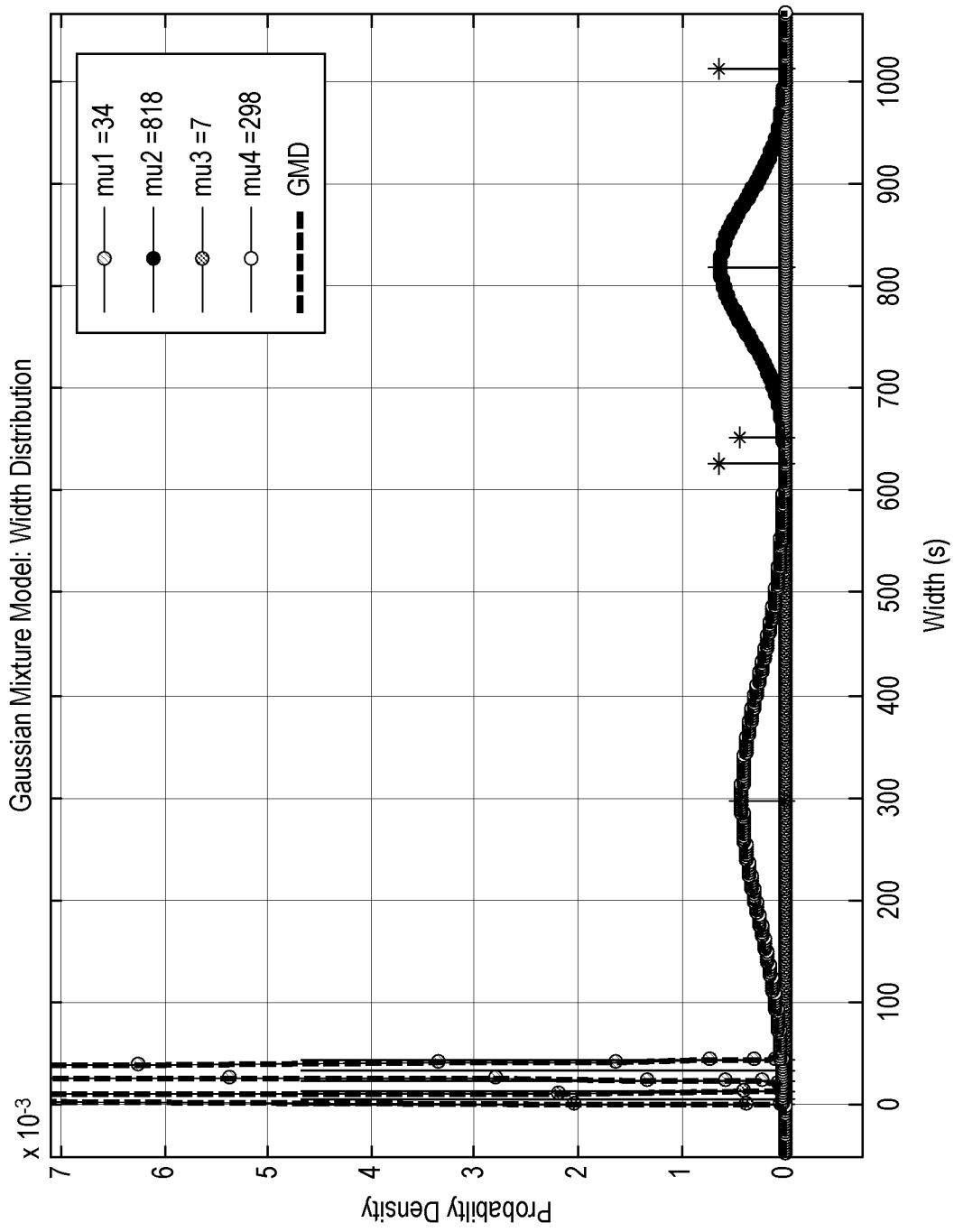
FIG. 5 illustrates a Gaussian mixture distribution approach which characterizes multiple modes in the semiconductor cycle.

Although a variety of different approaches are possible to enable the data to be segregated into that data related to a process and that data not related to a process, such as during a clean, one embodiment utilizes a Gaussian mixture distribution approach which characterizes multiple modes in the semiconductor cycle, as illustrated in FIG. 5. As can be seen in FIG. 5, the distribution shows two groups of peaks, those which are of very short duration (typically less than 100 seconds) and those which are of long duration (typically of greater than 100 seconds).

In this example, the number of peaks detected was 5190. The short peaks are identified as purge steps, whilst the long peaks are identified as "processes". This classification then enables the characteristic data which is not related to processes to be filtered out and so, in this embodiment, the filtering consists of considering only the long peaks.

In other embodiments, the data segregation is not threshold based, but is instead based on detecting patterns in the characteristic data following a movement away from an idle or nominal condition. Such pattern matching or identification typically relies on statistical or Gaussian mixture model representation and may utilise several different properties together—such as length, average value, standard deviation, area under curve, etc.). Such patterns may be pre-defined or learnt. The matching of characteristic data to the patterns may utilise different distance metrics and matching processes.

It will be appreciated that embodiments may also utilise techniques such as width distribution over different y-axis ranges or width distribution using both normalised and differentiated data.

Figure 6A:
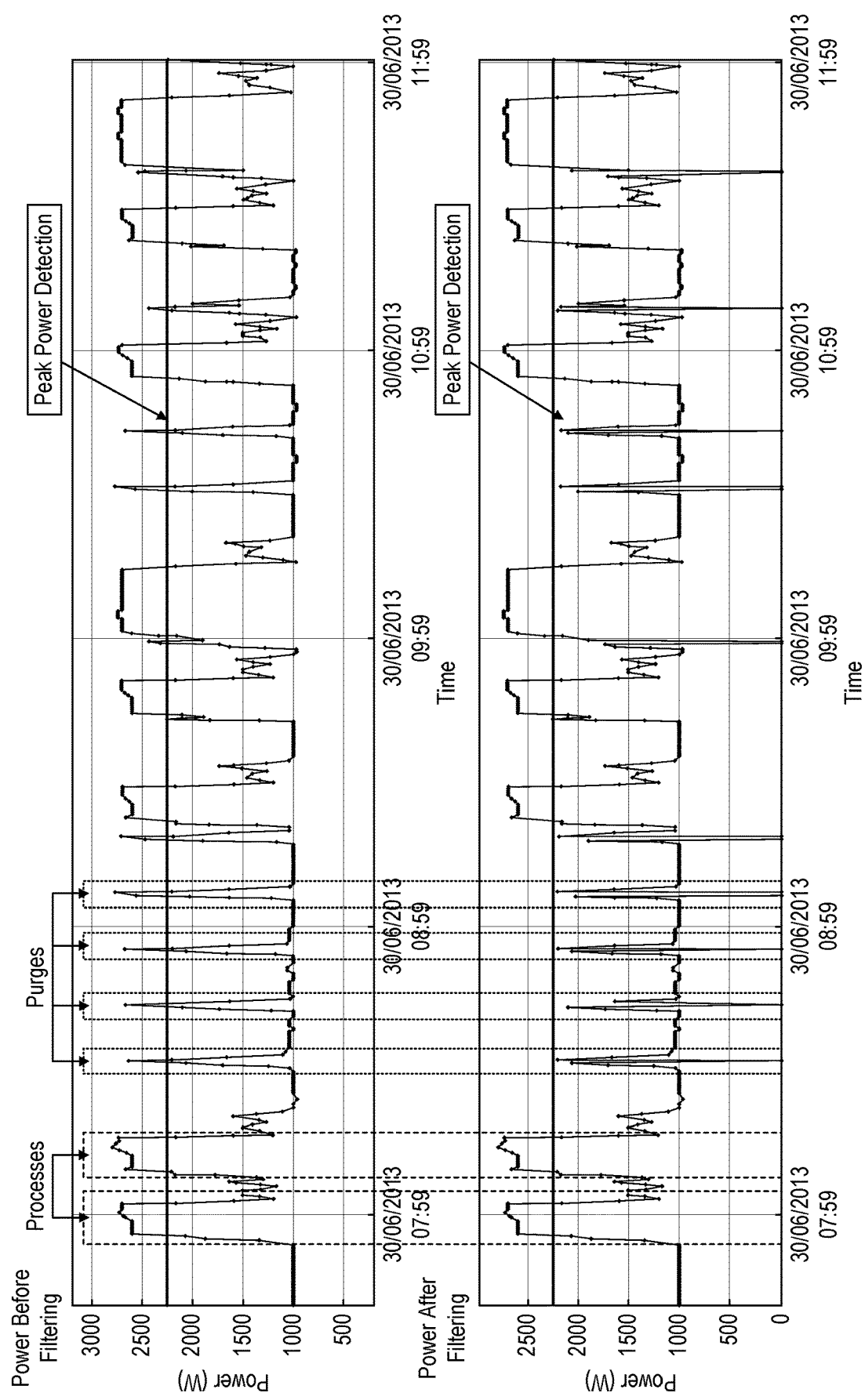
FIG. 6A illustrates in more detail the filtering of the characteristic data using a threshold to include that data identified as being related to processes and excludes that data which is identified as being unrelated to these processes.

FIG. 6A illustrates in more detail the filtering of the characteristic data which includes that data identified as being related to processes and excludes that data which is identified as being unrelated to these processes using the threshold technique.

Figure 6B:
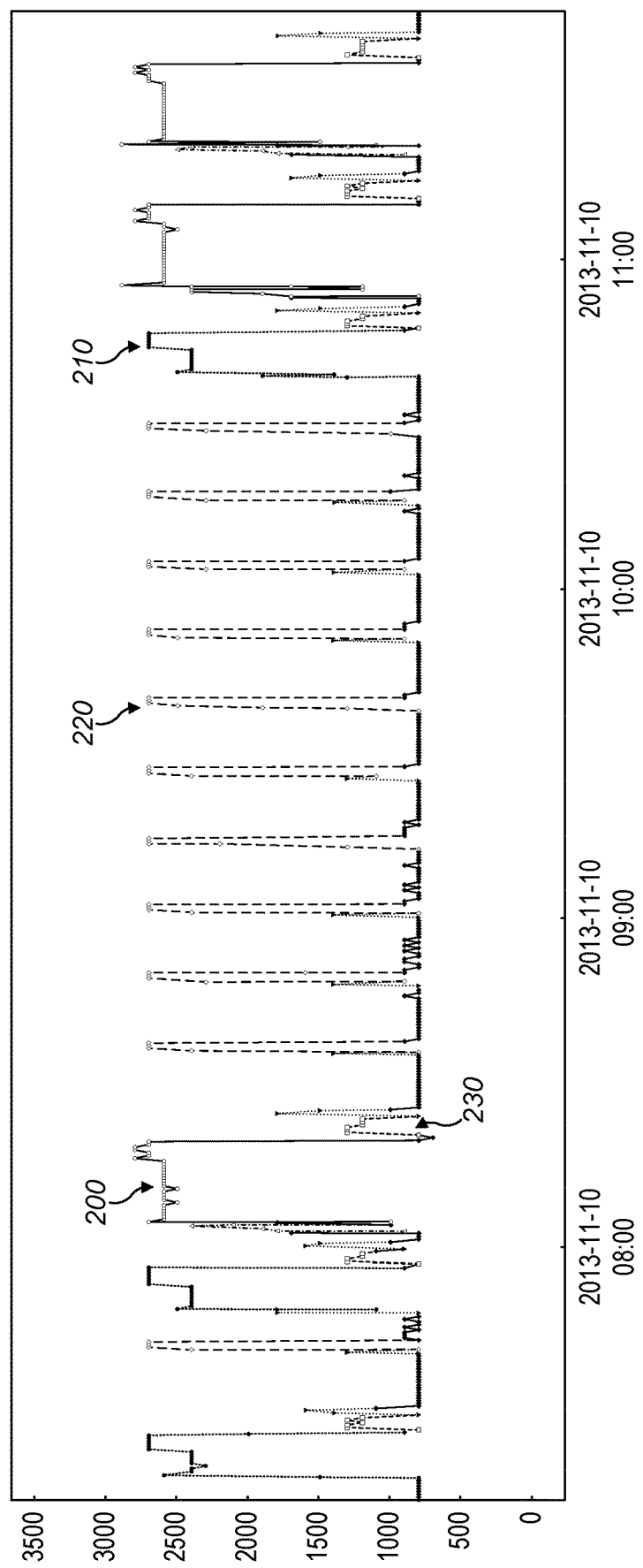
FIG. 6B illustrates the filtering of the characteristic data using repeated pattern matching based on a movement away from an idle condition.

FIG. 6B illustrates in more detail the filtering of the characteristic data which includes that data identified as being related to processes and excludes that data which is identified as being unrelated to these processes using the pattern matching technique. What constitutes contributing and non-contributing data will depend on the type of fault condition being predicted and the fault mechanism. In this example, data 200 is identified as being associated with process deposition step A, data 210 is identified as being associated with process deposition step B and data 230 is identified as being associated with clean steps (which are generally conducted at the end of process deposition steps A and B), each of which is contributing data since that data indicates that the tool operation during those periods will contribute to a particular eventual fault condition. The remaining data including the data 220 which is identified as being associated with purge steps is non-contributing data as the tool operation during those periods will not likely contribute to the particular eventual fault condition.

Data Analysis

Figure 7:
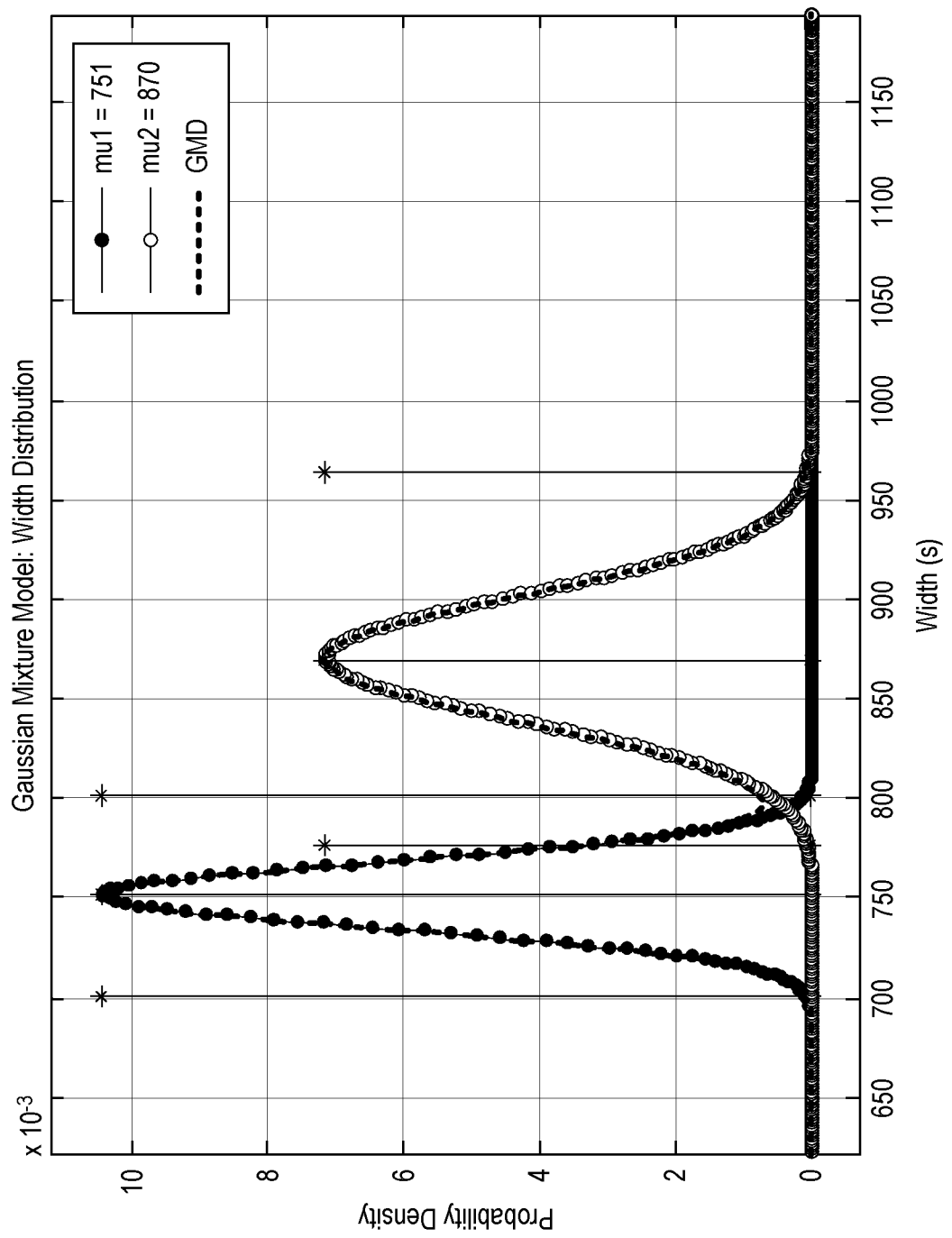
FIG. 7 illustrates another Gaussian mixture model analysis on the filtered data.

Once the characteristic data has been segregated, it can then be analysed. For example, it is possible to then perform another Gaussian mixture model analysis on the filtered data, as shown in FIG. 7. Such analysis reveals that the number of peaks detected is around 1196. In this example, information is available from the semiconductor processing tool 20 which indicates the number of processes performed over the period, which in this example was 1128. This shows that the characterization is accurate to a reasonable degree.

Although it is possible to utilize the characteristic data in subsequent processing, in this embodiment, the average value during each process is instead utilized. It will be appreciated that other statistical pre-processing could also be performed. Since the process start and end points are known, the exhaust pressure within that period is known and its average can be calculated for that particular process occurrence.

Figure 8A:
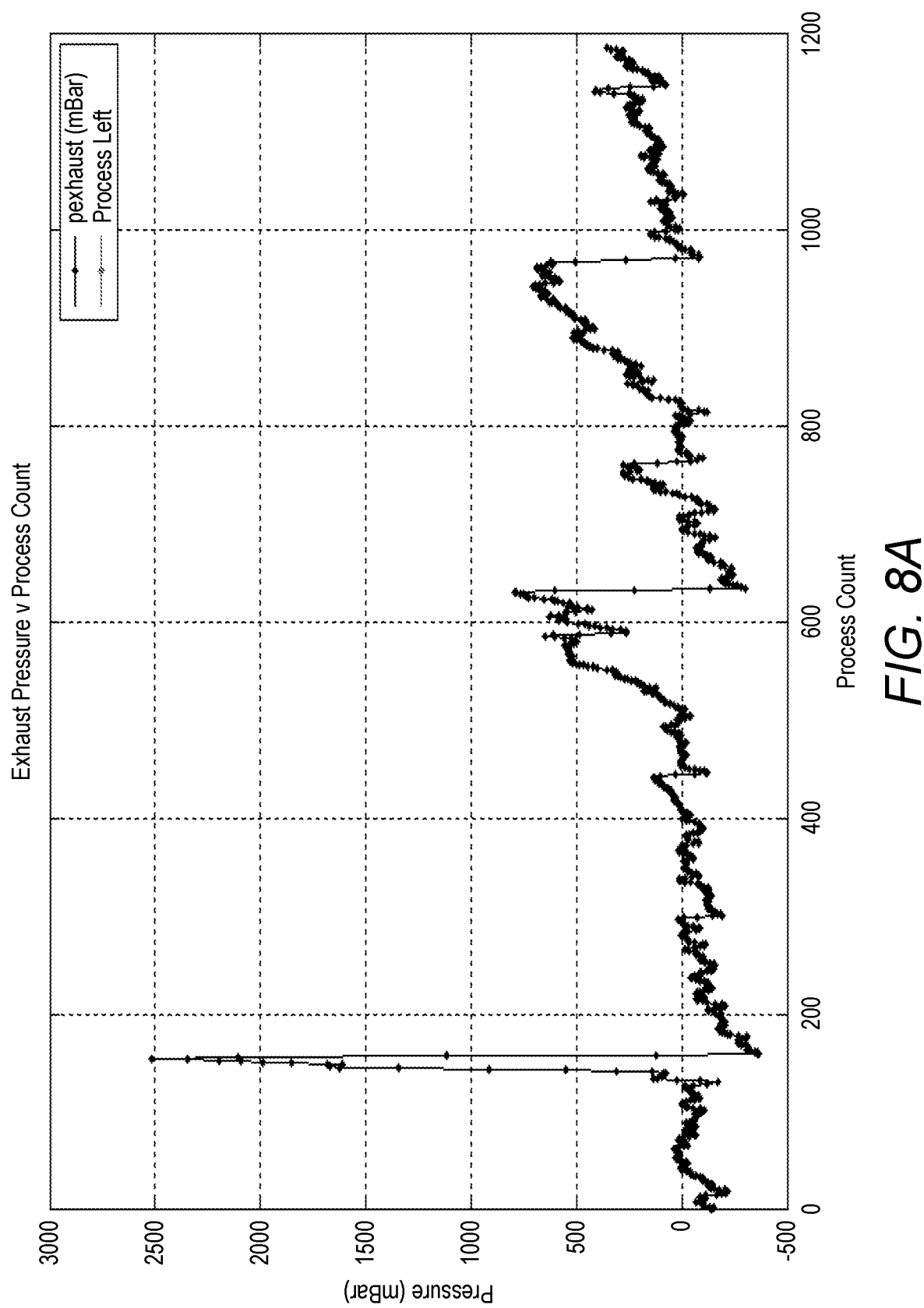
FIG. 8A is a graph that represents the average exhaust pressure versus process count.

FIG. 8A is a graph that represents the average exhaust pressure versus process count. From the data on this graph the Remaining Useful Life (RUL) before the next blockage failure can be determined, expressed as a function of the number of remaining processing steps. There are a variety of different approaches that can be used for estimating the RUL using the number of process deposition steps. Typically, an alert limit or hazard zone for particular parameters which represent a point of failure for the device is set. This hazard zone may be set as a result of safety constraints or previous experience and can be viewed as the point at which manual intervention is deemed necessary.

In this particular instance, the hazard zone is around 700 Pa. Servicing of the pump occurs at process counts 159, 634 and 972. The number of processes between services is 475 (Delta 2) and 338 (Delta 3).

Figure 8B:
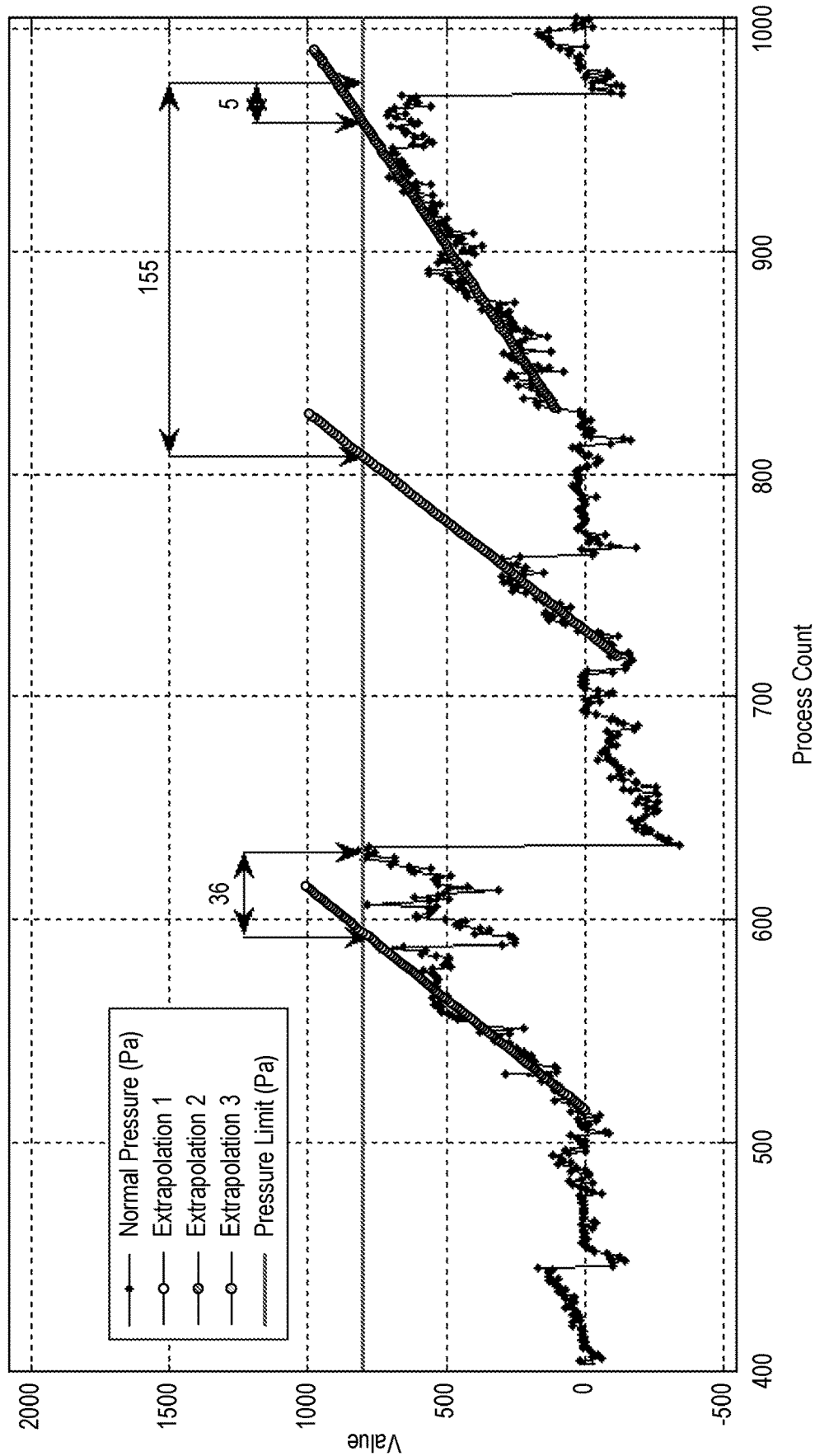
FIG. 8B shows a simple extrapolation of some of the data.

FIG. 8B shows a simple extrapolation of some of the data which can be used to estimate the RUL by determining the number of process cycles until the pressure threshold is crossed.

Linear Regression

Figure 9:
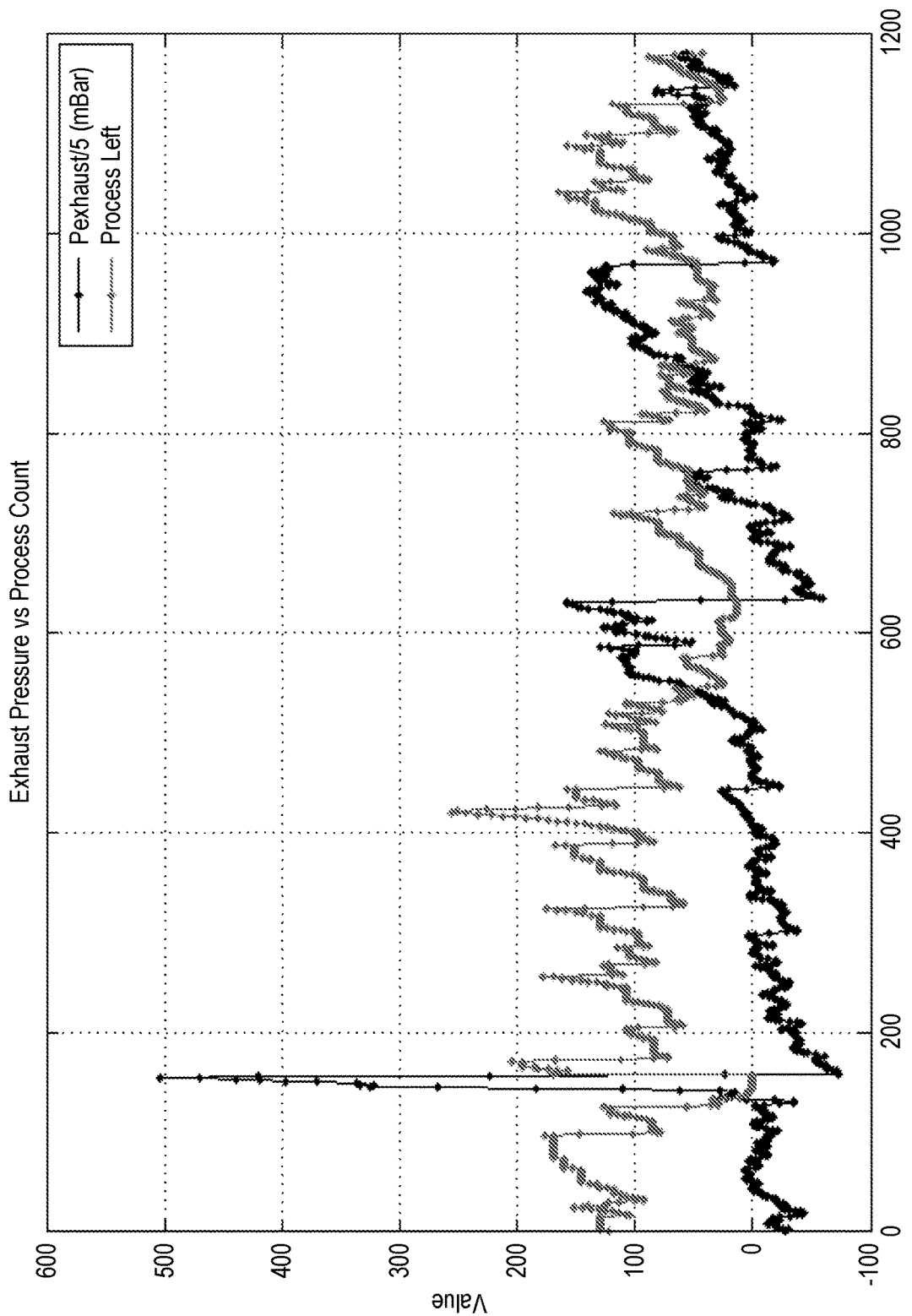
FIG. 9 illustrates the results of a linear regression technique for estimating remaining useful life.

FIG. 9 illustrates the results of a linear regression technique for estimating RUL. This technique consists of extrapolating the exhaust pressure using five points to estimate the parameter "gain" and "offset" of the following linear equation:

$$\text{Pressure}(t) = \text{Gain} \times t + \text{Offset} \quad \text{(Equation 1)}$$

The number of processes left before exhaust blockage is calculated in accordance with:

$$\text{LifeRemaining}(t) = (\text{Limit} - \text{Pressure}(t))/(\text{Gain}(t)) \quad \text{(Equation 2)}$$

It can be seen that the number of processes left estimated by linear extrapolation is not steady and constantly fluctuates due to sudden drops of exhaust pressure. During periods that the increase in pressure is constant, then the estimated number of processes left can be quite accurate. This technique is particularly suited to certain failure regions.

Polynomial Regression

Figure 10:
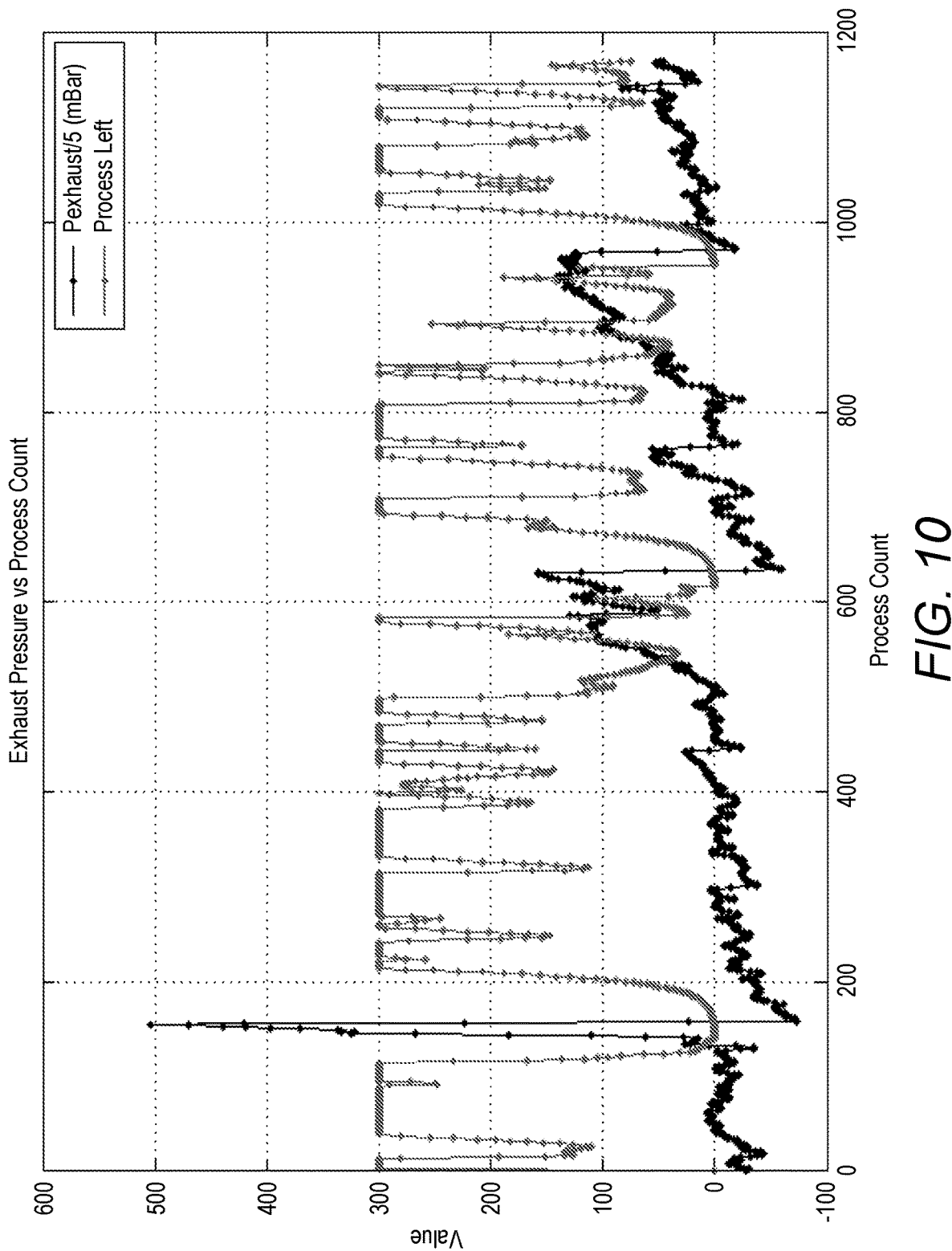
FIG. 10 illustrates the estimated remaining life expectancy using a polynomial regression.

FIG. 10 illustrates the estimated remaining life expectancy using a polynomial regression. This technique consists of extrapolating the exhaust pressure using five points to estimate the parameters "A", "B", "C" and "offset" of the following polynomial equation:

$$\text{Pressure}(t) = A \cdot (t^2) + B \cdot t + C \quad \text{(Equation 3)}$$

The number of processes left estimated by polynomial extrapolation is also not steady and constantly fluctuates due to sudden drops of exhaust pressure. However, once again, when the increase in pressure is constant, the number of processes left is reasonably accurate.

Differential and Proportional Calculation

Figure 11:
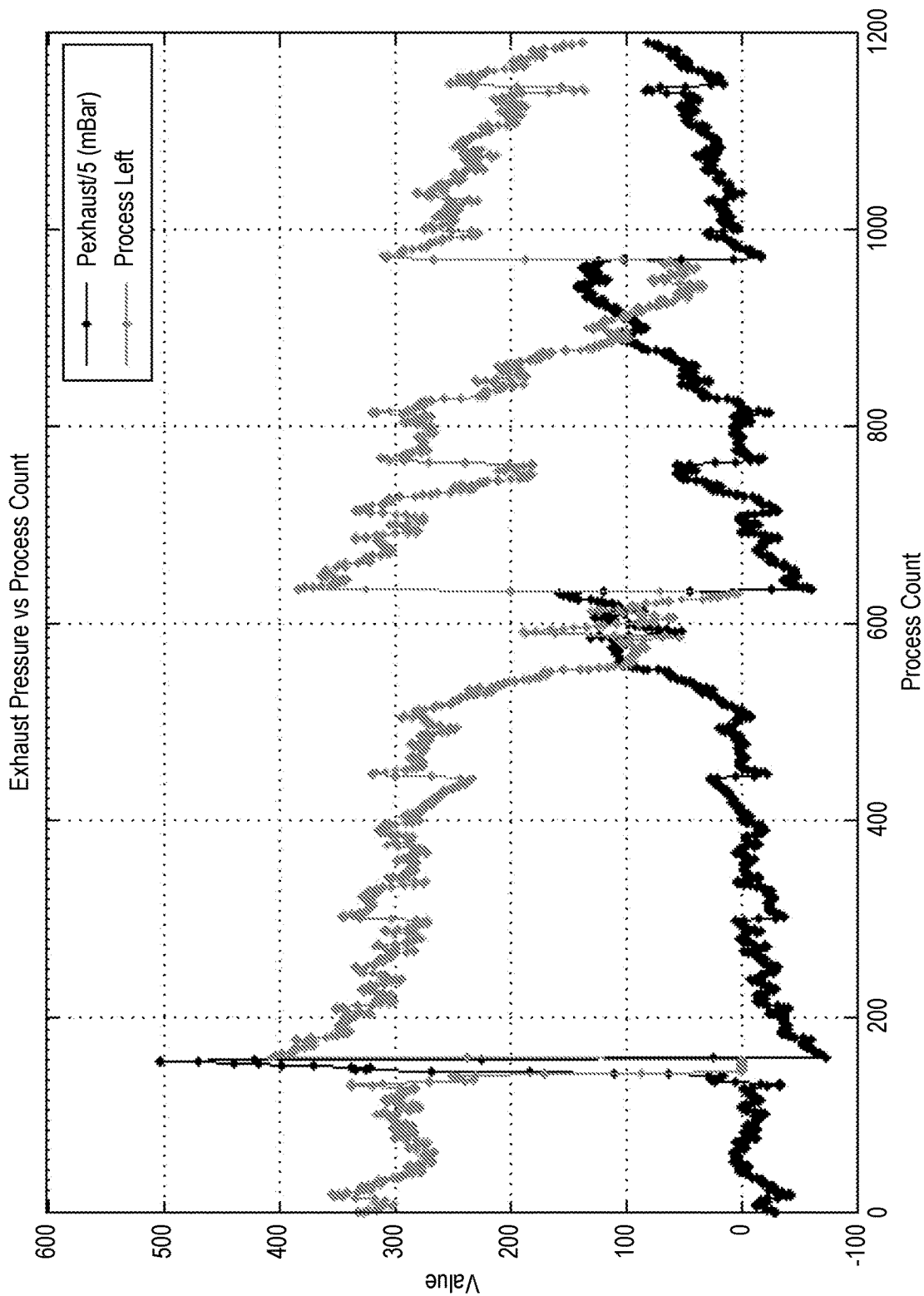
FIG. 11 illustrates a differential and proportional calculation approach to estimating the number of processing steps left.

FIG. 11 illustrates a differential and proportional calculation approach to estimating the number of processing steps left. Once again, the number of processes left is not steady and is constantly fluctuating due to sudden drops of exhaust pressure.

$$\text{LifeRemaining}(t) = [\text{Limit} - \text{Pressure}(t)] \times \text{Gain} \quad \text{(Equation 4)}$$

The accuracy depends on the gain, which is constant.

Integral-Based Calculation

Figure 12:
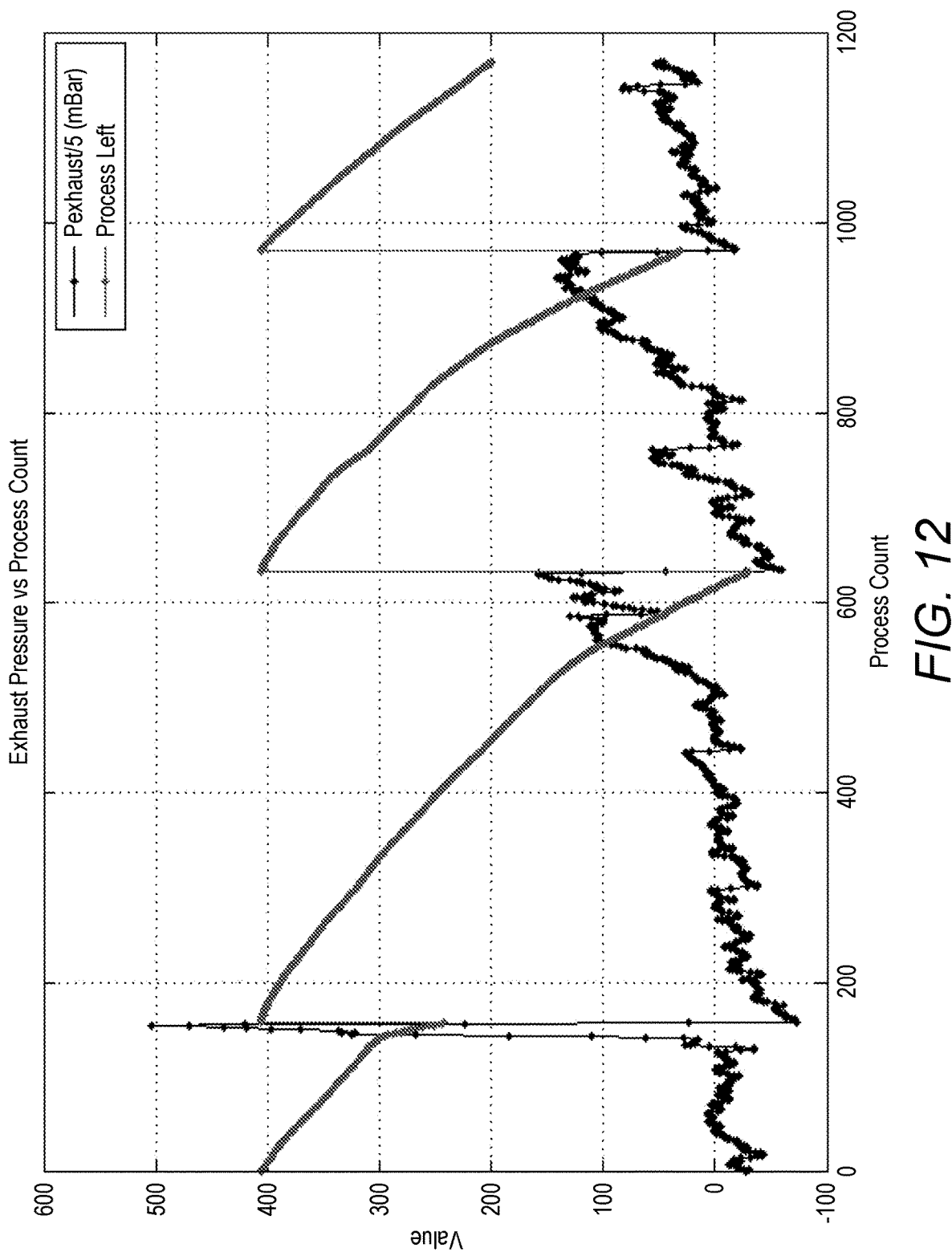
FIG. 12 illustrates the estimated remaining useful life using an integral-based technique.

FIG. 12 illustrates the estimated remaining useful life using an integral-based technique. The integral of the exhaust pressure between services is:

$$\text{Area\_1} = 0.9853\ e{+}05$$

$$\text{Area\_2} = 2.6409\ e{+}05$$

$$\text{Area\_3} = 2.2636\ e{+}05$$

Note that Delta 2 is significantly larger than Delta 3 (28% larger). However, note that Area 2 is larger than Area 3 (larger by 14%), but not as large as the corresponding Delta.

By calculating the Rate=Area/Delta we obtain:

0.0056 (Rate 1); and 0.0067 (Rate 2).

It can be seen that the rates are very close (0.0061+/−0.005).

The approach consists of expressing the Remaining Useful Life as an area that represents a given number of processes. The Remaining Useful Life is calculated in accordance with:

$$\text{LifeRemaining}(t) = (cte\text{Area} - \int(\text{Pressure}(t) + \text{Offset})dt)/ \\ cte\text{Area} \times cte\text{Process} \quad \text{Equation 5}$$

As can be seen, the number of processes left before servicing decreases steadily, despite the pressure value increasing, stabilising and then ramping again. The accuracy can be improved by adjusting the area representative of the life expectancy that may decrease from one service to the next. The fact that the pressure does not consistently increase in line with the process steps, particularly after a previous service, creates some uncertainty with regard to the RUL estimation. However, the value does ramp after a critical area or mass is reached. The real time number of processes left could be reported as a processing rate expressed in number of processes per hours.

In terms of fluctuation, the integral base calculation offers the best solution. In terms of precision, the linear regression seems to be the most appropriate. Accordingly, the model that determines the number of processes left before exhaust blockage could switch between these two calculations, depending on the level of alert. This means that a combination of integral and a regressive/extrapolative/model-based approach may be used (for example, a switch-over to a model-based approach at this event horizon). Such techniques can use, for example, particle filters, Kalman filters and the like. When using such modelling techniques/combinations of mathematical techniques then measures of confidence and probabilities may be utilized, as illustrated in FIGS. 15 to 20.

Figure 15:
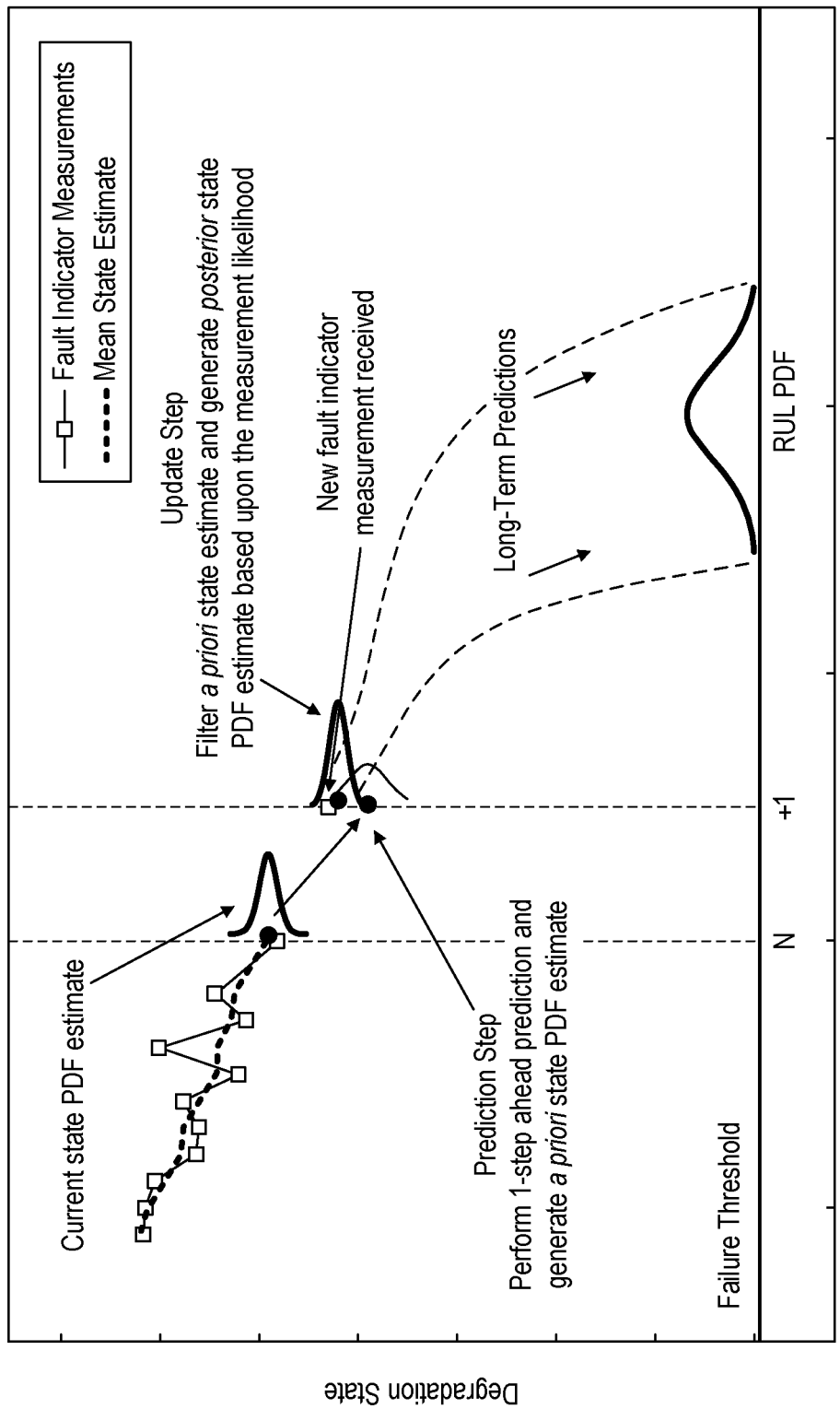
FIG. 15 illustrates the key concepts of a dynamic model-based approach.

FIG. 15 illustrates the key concepts of the dynamic model-based approach, based upon the use of recursive Bayesian estimation techniques.

Figure 16:
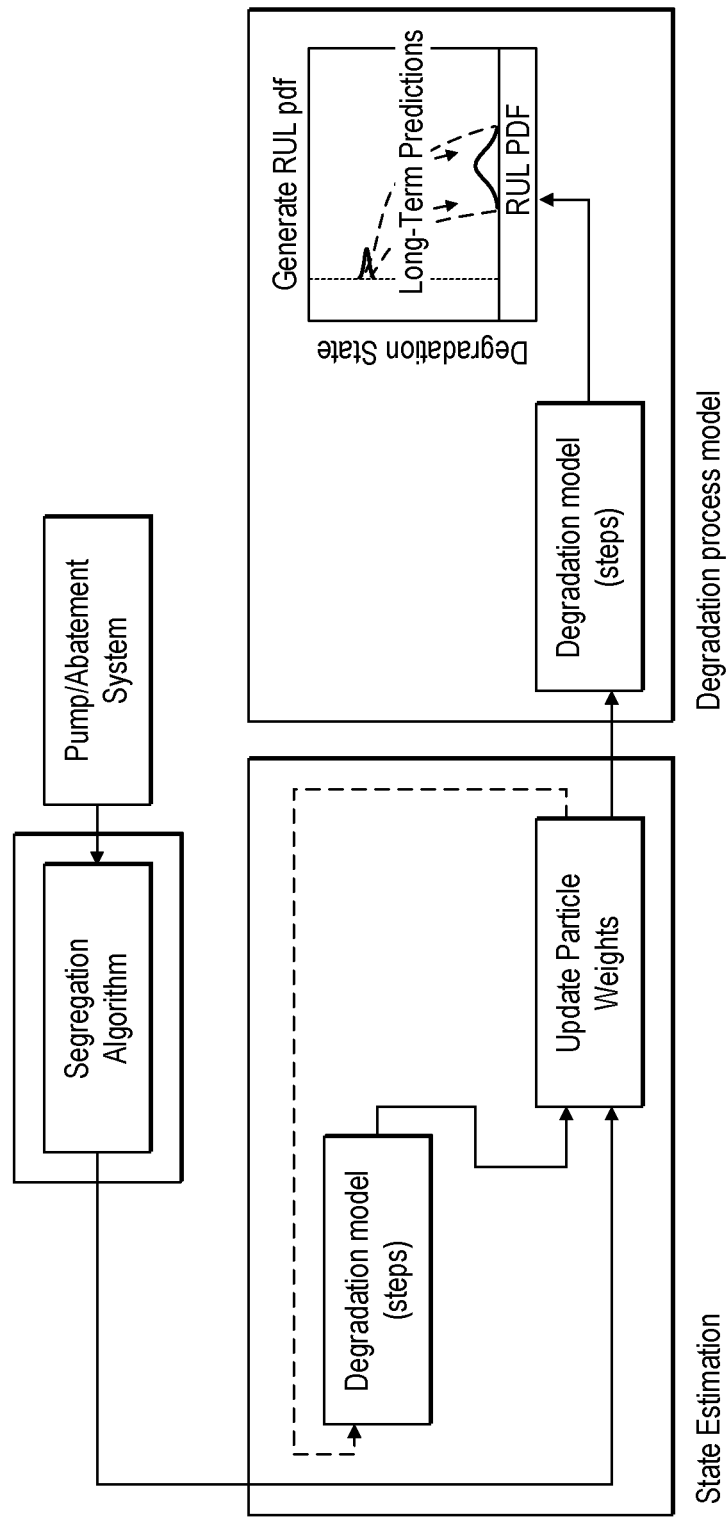
FIG. 16 shows the particle filtering framework based on the number of steps.

FIG. 16 shows the particle filtering framework based on the number of steps—with a segregation step, as well as state estimation and the generation of long-term predictions.

Figure 17:
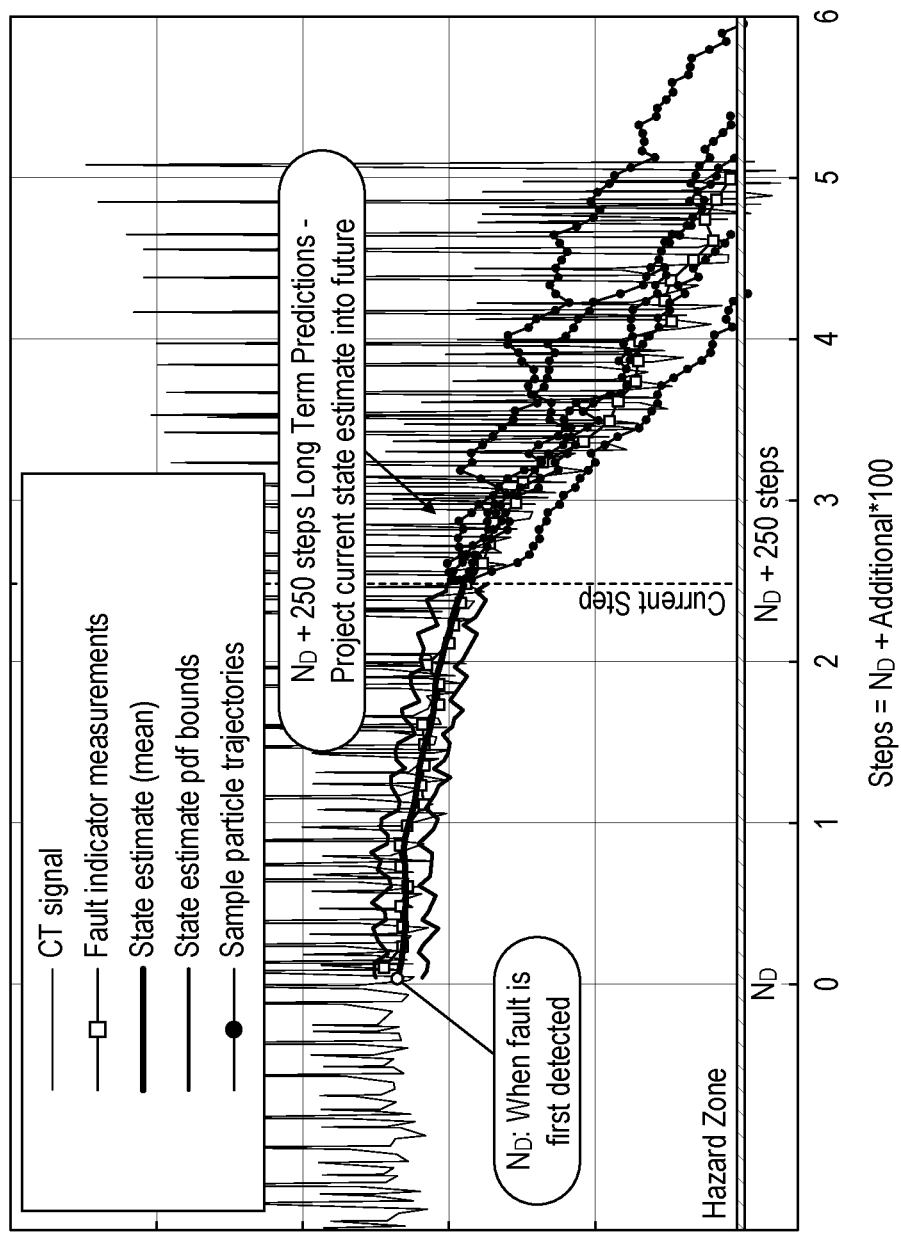
FIG. 17 illustrates particle filtering as applied to an abatement TPU failure example.

FIG. 17 illustrates particle filtering as applied to an abatement TPU failure example—with state estimation and generation of long term predictions.

Figure 18:
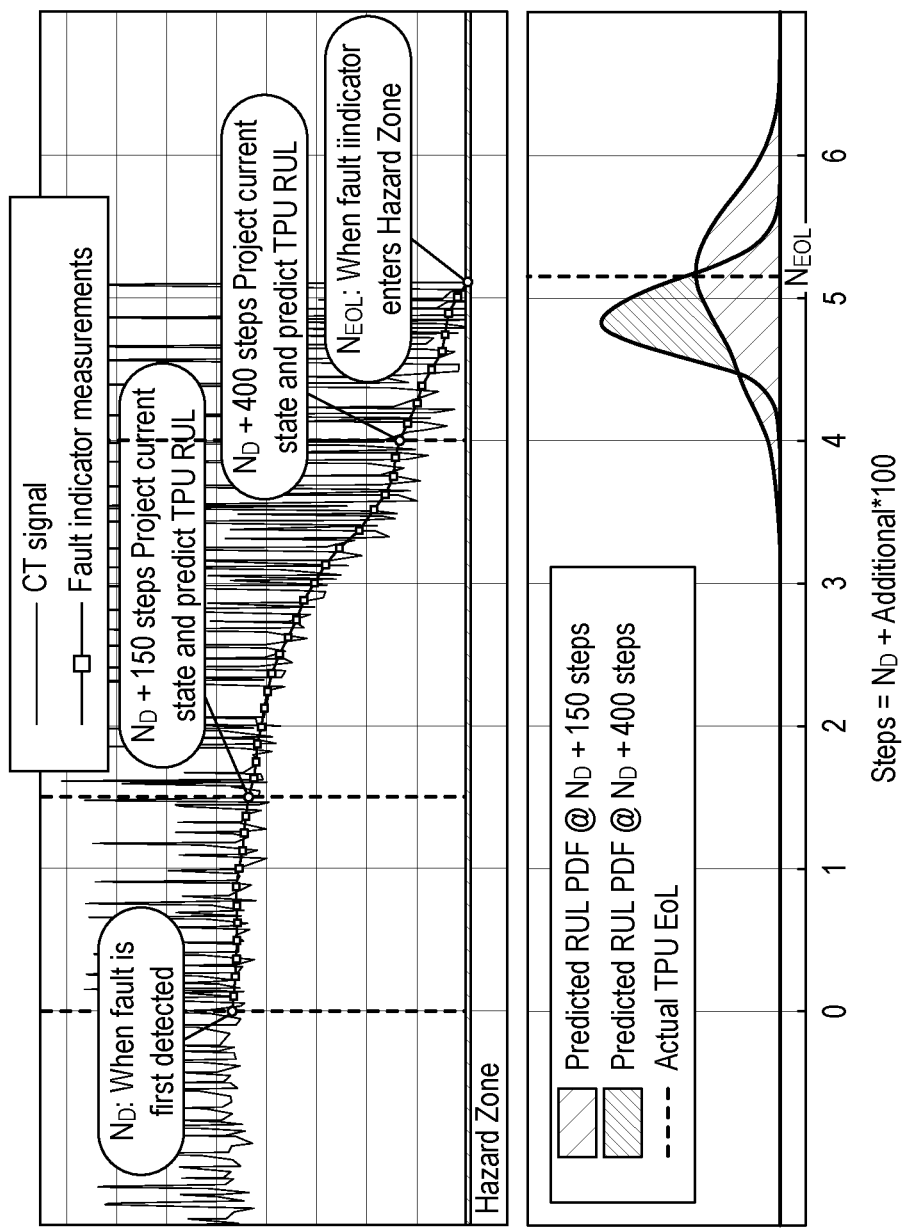
FIG. 18 illustrates the RUL probability distribution function generated from long-term predictions made at two different times.

FIG. 18 illustrates the RUL probability distribution function generated from long-term predictions made at two different times.

Figure 19:
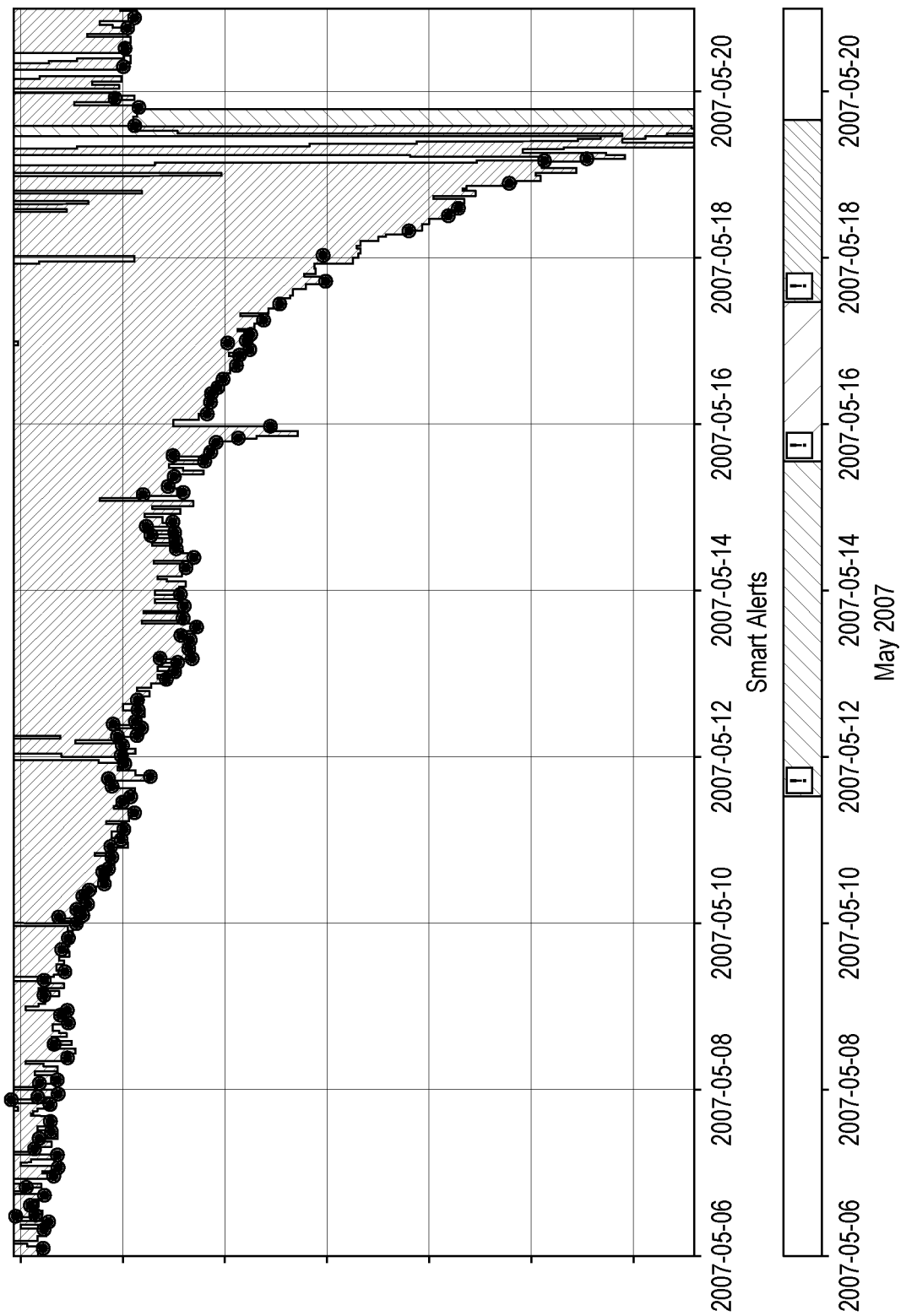
FIG. 19 provides context and is the original TPU failure example providing the data upon which the long-term predictions were made.

FIG. 19 provides context and is the original TPU failure example providing the data upon which the long-term predictions were made.

Figure 20:
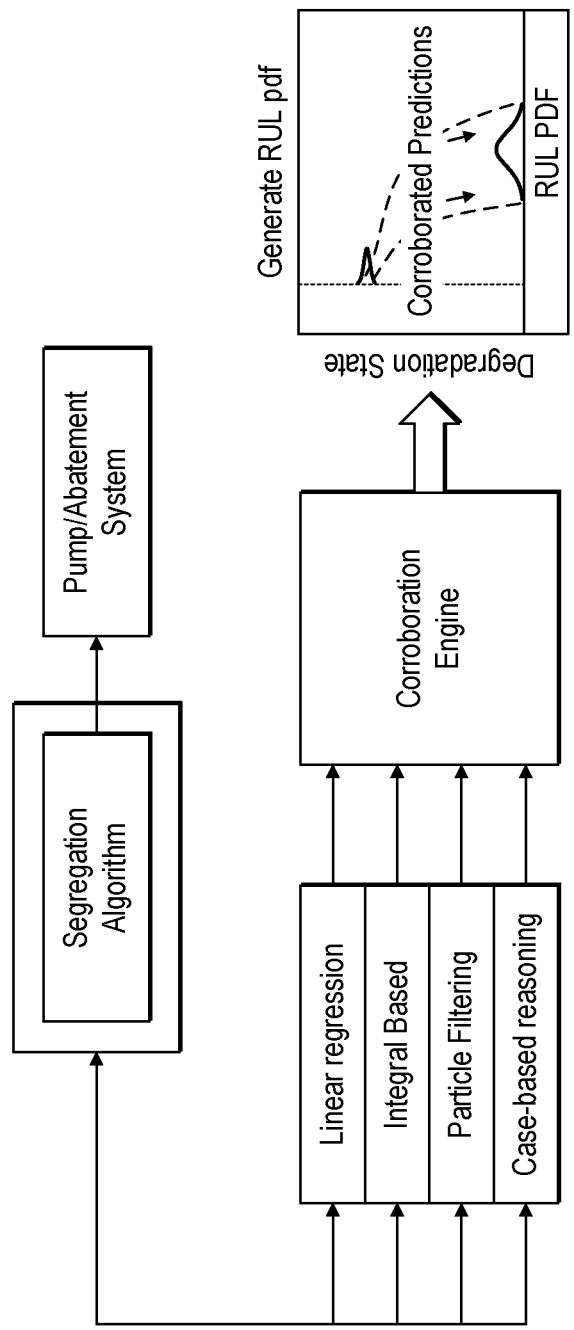
FIG. 20 illustrates the segregation step, followed by discrete, separate mathematical and experience-based techniques which are then input to a corroboration engine which generates a more informed corroborated prediction of RUL.

FIG. 20 illustrates the segregation step, followed by discrete, separate mathematical and experience-based techniques which are then input to a corroboration engine which generates a more informed corroborated prediction of RUL, mindful of the different nuances of each respective discrete algorithm, according to one embodiment.

Alerts

Figure 13:
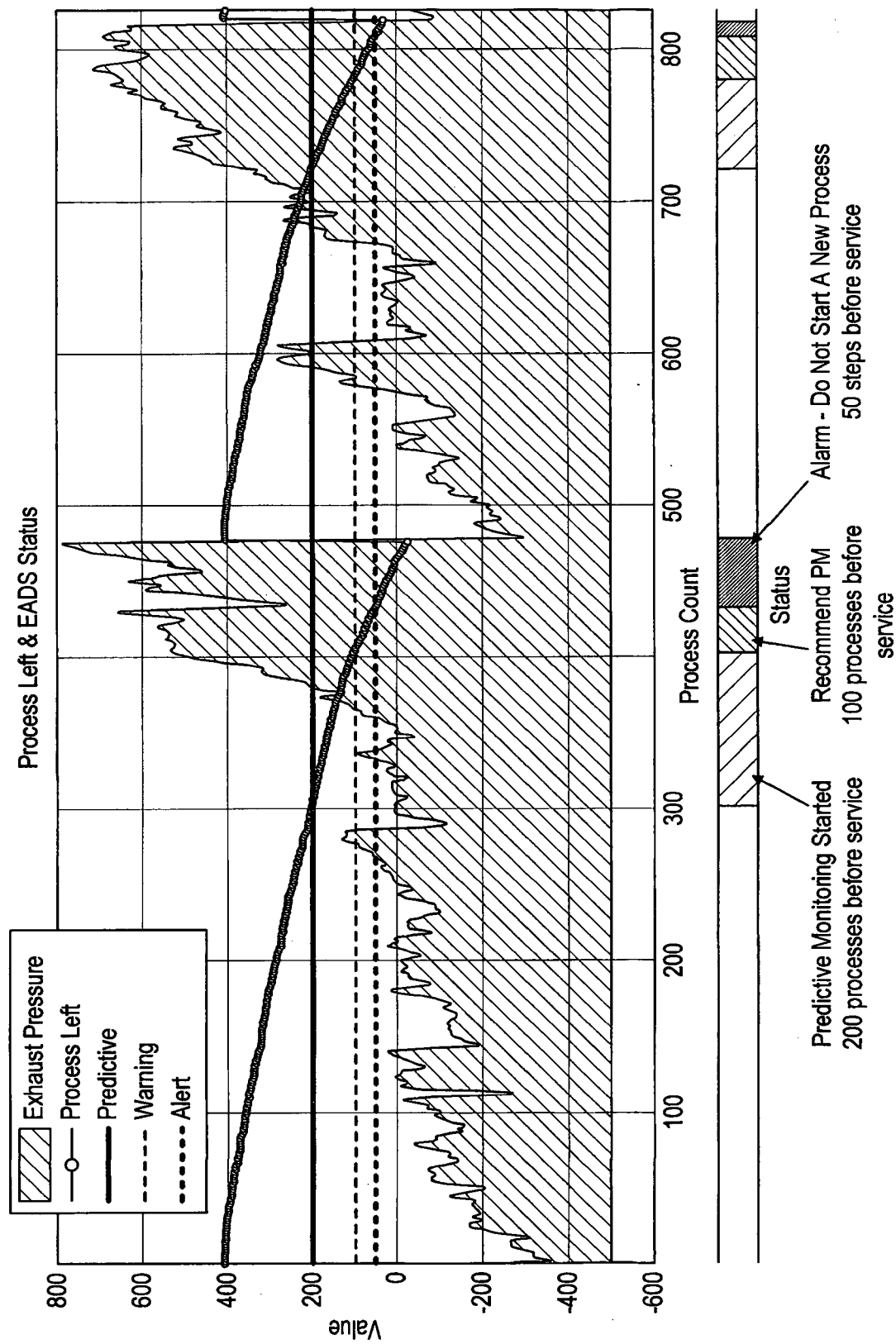
FIG. 13 illustrates exhaust pressure, estimated number of processes left and three different alert or warning thresholds.

FIG. 13 illustrates exhaust pressure, estimated number of processes left and three different alert or warning thresholds. In this example, an alert indication is given when it is estimated that 200, 100 and 50 processes respectively remain before a service is required.

External Faults

Figure 14:
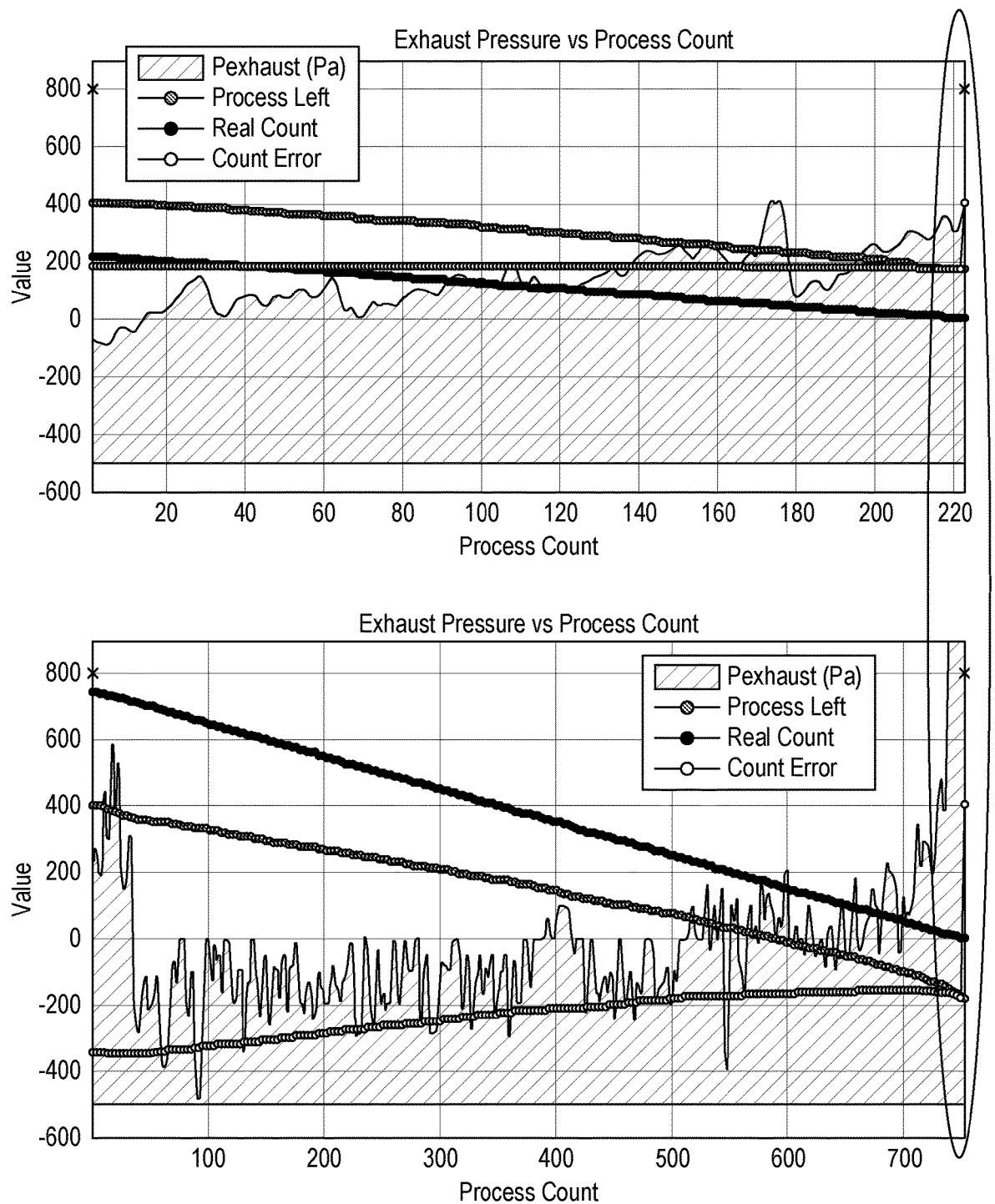
FIG. 14 illustrates fault identification of an issue external to the pump and abatement system; made possible through segmentation of the customer process.

By understanding pump or other parameter behaviour during the different semiconductor process modes and how the semiconductor cycle can affect different fault types, it is also possible to determine if a fault is likely to occur outside the abatement apparatus 30. Indeed, faults can be detected in the processing tool 20 or the abatement apparatus 30 from sensors in the vacuum pumps 35A, 35B. However, the data typically needs to be corroborated with information downstream to pinpoint the nature of the faults. For example, consider a leak in the chamber of the processing tool 20, the pressure in the chamber increases, which is confirmed by a rise in exhaust pressure during idling, as illustrated in FIG. 14. Also, for example, consider a blockage. A variety of parameters can increase, depending on the nature of the blockage. However, irrespective of the parameters, blockages worsen as a direct consequence of the process deposition steps. Taking the scenario where pump blockage parameters increase, not during process steps but during process cleans, this points to the occurrence of a different problem—a leak. So whilst the parameter trends may help to identify blockages, by overlaying the semiconductor cycle information it is possible to determine whether the fault is elsewhere.

Accordingly, it can be seen that embodiments use the pump or other devices characterize the semiconductor cycle and understand the cycle's impact on known faults. This approach relies on some level of validation of the pump process characteristic. However, once trained, this approach should be entirely independent of separate tool process-based data.

Although illustrative embodiments of the disclosure have been disclosed in detail herein, with reference to the accompanying drawings, it is understood that the disclosure is not limited to the precise embodiment and that various changes and modifications can be effected therein by one skilled in the art without departing from the scope of the disclosure as defined by the appended claims and their equivalents.

The invention claimed is:

1. A monitoring apparatus for monitoring at least one processing tool during processing of an effluent stream from a semiconductor processing tool, the monitoring apparatus comprising:
reception logic circuitry configured to receive processing characteristic data generated by the at least one processing tool during the processing of the effluent stream;
segregation logic circuitry configured to segregate the processing characteristic data into contributing processing characteristic data associated with contributing periods which contribute to a condition of the at least one processing tool and non-contributing processing characteristic data associated with non-contributing periods which fail to contribute to the condition of the at least one processing tool; and
fault logic circuitry configured to:
determine a status of the condition by utilizing the contributing processing characteristic data and excluding the non-contributing processing characteristic data; and
provide an indication of an estimated number of contributing periods until the contributing processing characteristic data crosses a fault threshold.

2. The apparatus of claim 1, wherein the contributing periods comprise periods when active semiconductor processing occurs and the non-contributing periods comprise periods when no active semiconductor processing occurs.

3. The apparatus of claim 1, wherein the contributing periods comprise periods when deposition occurs and the non-contributing periods comprise periods when no deposition occurs.

4. The apparatus of claim 1, wherein the segregation logic circuitry is configured to identify the contributing periods and the non-contributing periods by at least one of comparing the processing characteristic data with a threshold amount, detecting an amount of deviation and pattern matching.

5. The apparatus of claim 1, wherein the fault logic circuitry is configured to combine contributing processing characteristic data from the contributing periods to provide combined contributing processing characteristic data.

6. The apparatus of claim 5, wherein the fault logic circuitry is configured to extrapolate the combined contributing processing characteristic data to estimate future contributing processing characteristic data.

7. The apparatus of claim 5, wherein the fault logic circuitry is configured to extrapolate the combined contributing processing characteristic data to estimate future contributing processing characteristic data using an estimating model.

8. The apparatus of claim 7, wherein the estimating model is operable to extrapolate the combined contributing processing characteristic data to estimate future contributing processing characteristic data using at least one of a linear regression, a polynomial regression, a differential proportional calculation, an integral based calculation, Kalman filtering, particle filtering and case-based reasoning for a first period and another at least one of the linear regression, the polynomial regression, the differential proportional calculation, the integral based calculation, Kalman filtering, particle filtering and case-based reasoning for a second period.

9. The apparatus of claim 7, wherein the estimating model is operable to calibrate recursively using a difference between the future contributing processing characteristic data and subsequently-received processing characteristic data.

10. The apparatus of claim 5, wherein the fault logic circuitry is configured to apply a time-based correction factor to the future contributing processing characteristic data during non-contributing periods.

11. The apparatus of claim 5, wherein the fault logic circuitry is configured to determine a fault condition when the future contributing processing characteristic data crosses a fault threshold.

12. The apparatus of claim 5, wherein the fault logic circuitry is configured to identify a fault condition when the non-contributing processing characteristic data deviates by more than a selected amount during the non-contributing periods.

13. A method of monitoring at least one processing tool during processing of an effluent stream from a semiconductor processing tool, the method comprising:
receiving processing characteristic data generated during the processing of the effluent stream;
segregating the processing characteristic data into contributing processing characteristic data associated with contributing periods which contribute to a condition of the at least one processing tool and non-contributing processing characteristic data associated with non-contributing periods which fail to contribute to the condition;
determining a status of the condition by utilizing the contributing processing characteristic data and excluding the non-contributing processing characteristic; and
providing an indication of an estimated number of contributing periods until the contributing processing characteristic data crosses a fault threshold.

14. A computer program product comprising instructions that, when executed, cause a computer to:
receive processing characteristic data generated during the processing of the effluent stream;
segregate the processing characteristic data into contributing processing characteristic data associated with contributing periods which contribute to a condition of the at least one processing tool and non-contributing processing characteristic data associated with non-contributing periods which fail to contribute to the condition; and
determine a status of the condition by utilizing the contributing processing characteristic data and excluding the non-contributing processing characteristic data; and
provide an indication of an estimated number of contributing periods until the contributing processing characteristic data crosses a fault threshold.

15. The method of claim 13, wherein the contributing periods comprise periods when active semiconductor processing occurs and the non-contributing periods comprise periods when no active semiconductor processing occurs.

16. The method of claim 13, wherein segregating the processing characteristic data comprises identifying the contributing periods and the non-contributing periods by at least one of comparing the processing characteristic data with a threshold amount, detecting an amount of deviation and pattern matching.

17. The method of claim 13, wherein determining the status of the condition comprises combining contributing processing characteristic data from the contributing periods to provide combined contributing processing characteristic data.

18. The method of claim 17, wherein determining the status of the condition comprises extrapolating the combined contributing processing characteristic data to estimate future contributing processing characteristic data using an estimating model.

19. The method of claim 18, wherein the estimating model is operable to extrapolate the combined contributing processing characteristic data to estimate future contributing processing characteristic data using at least one of a linear regression, a polynomial regression, a differential proportional calculation, an integral based calculation, Kalman filtering, particle filtering and case-based reasoning for a first period and another at least one of the linear regression, the polynomial regression, the differential proportional calculation, the integral based calculation, Kalman filtering, particle filtering and case-based reasoning for a second period.

* * * * *